US010720342B2

(12) United States Patent  
Sasaki et al.

(10) Patent No.: US 10,720,342 B2  
(45) Date of Patent: Jul. 21, 2020

(54) SUBSTRATE TREATING APPARATUS AND SUBSTRATE TREATING METHOD

(71) Applicant: SCREEN Holdings Co., Ltd., Kyoto (JP)

(72) Inventors: Yuta Sasaki, Kyoto (JP); Yosuke Hanawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 127 days.

(21) Appl. No.: 15/821,253

(22) Filed: Nov. 22, 2017

(65) Prior Publication Data

US 2018/0182646 A1 Jun. 28, 2018

(30) Foreign Application Priority Data

Dec. 26, 2016 (JP) .................. 2016-250700  
Oct. 23, 2017 (JP) .................. 2017-204294

(51) Int. Cl.
| | | |
|---|---|---|
| *F26B 5/06* | (2006.01) | |
| *H01L 21/67* | (2006.01) | |
| *H01L 21/02* | (2006.01) | |
| *B08B 3/04* | (2006.01) | |

(52) U.S. Cl.
CPC .. *H01L 21/67034* (2013.01); *H01L 21/02057* (2013.01); *H01L 21/67028* (2013.01); *H01L 21/67051* (2013.01); *B08B 3/04* (2013.01)

(58) Field of Classification Search
CPC ......... H01L 21/67034; H01L 21/02057; H01L 21/67028; H01L 21/67051; B08B 3/04  
USPC .......................... 34/284, 285, 286, 287, 289  
See application file for complete search history.

(56) References Cited

U.S. PATENT DOCUMENTS

| | | | |
|---|---|---|---|
| 2012/0073599 A1 | 3/2012 | Miya et al. ................. 134/4 |
| 2013/0008868 A1* | 1/2013 | Uozumi ............... G03F 7/162 216/41 |
| 2013/0167877 A1* | 7/2013 | Fujiwara ............... B08B 3/04 134/26 |
| 2014/0272554 A1* | 9/2014 | Yanagi ........... H01M 10/0562 429/189 |
| 2014/0290090 A1* | 10/2014 | Campion ............ F26B 20/00 34/381 |

(Continued)

FOREIGN PATENT DOCUMENTS

| | | |
|---|---|---|
| EP | 3 249 682 A1 | 11/2017 |
| JP | 2005-223184 A | 8/2005 |

(Continued)

OTHER PUBLICATIONS

Extended European Search Report dated Apr. 30, 2018 in corresponding European Application No. 17202346.7.

*Primary Examiner* — John P McCormack  
(74) *Attorney, Agent, or Firm* — Ostrolenk Faber LLP

(57) ABSTRACT

A substrate processing of the present invention includes a supplying unit which supplies a process liquid containing a sublimable substance in a molten state to the pattern-formed surface of a substrate, a solidifying unit which solidifies the process liquid on the pattern-formed surface so as to form a solidified body and a sublimating unit which sublimes the solidified body so as to remove the solidified body from the pattern-formed surface, and the vapor pressure of the process liquid at a temperature of 20 to 25° C. is equal to or more than 5 kPa, and the surface tension thereof at a temperature of 20 to 25° C. is equal to or less than 25 mN/m.

12 Claims, 13 Drawing Sheets

(56) References Cited

U.S. PATENT DOCUMENTS

| | | | | |
|---|---|---|---|---|
| 2016/0071747 A1* | 3/2016 | Uozumi | ............... | G03F 7/162 156/345.15 |
| 2016/0307773 A1* | 10/2016 | Lee | ............... | H01L 21/31116 |
| 2017/0117164 A1 | 4/2017 | Kikuchi et al. | ............... | 134/19 |
| 2017/0178892 A1* | 6/2017 | Sato | ............... | H01L 21/02057 |

FOREIGN PATENT DOCUMENTS

| | | |
|---|---|---|
| JP | 2012-243869 A | 12/2012 |
| JP | 2013-016699 A | 1/2013 |
| JP | 2013-042094 A | 2/2013 |
| JP | 2013-258272 A | 12/2013 |
| JP | 2015-050414 A | 3/2015 |
| JP | 2015-142069 A | 8/2015 |
| JP | 2017-224783 A | 12/2017 |
| TW | 201606072 A | 2/2016 |
| WO | WO 2015/189697 A1 | 12/2015 |

\* cited by examiner

SUBSTRATE TREATING APPARATUS AND SUBSTRATE TREATING METHOD

BACKGROUND OF THE INVENTION

Field of the Invention

The present invention relates to a substrate treating apparatus and a substrate treating method which remove, from substrates, liquids adhered to various types of substrates (hereinafter simply referred to as "substrates") such as a semiconductor substrate, a photomask glass substrate, a liquid crystal display glass substrate, a plasma display glass substrate, an FED (Field Emission Display) substrate, an optical disc substrate, a magnetic disc substrate and a magneto-optical disc substrate.

Description of Related Art

In the manufacturing process of an electronic component such as a semiconductor device or a liquid crystal display device, various types of wet processing using liquids are performed on a substrate, and thereafter dry processing for removing the liquids adhered to the substrate by the wet processing is performed on the substrate.

As the wet processing, washing processing which removes contaminants on the surface of the substrate can be mentioned. For example, on the surface of a substrate in which a fine pattern having recesses and projections is formed by a dry etching step, a reaction byproduct (etching residue) is present. In addition to the etching residue, a metal impurity, an organic contaminant and the like may be adhered to the surface of the substrate, and in order to remove these substances, washing processing such as for supplying a washing liquid to the substrate is performed.

After the washing processing, rinse processing which removes the washing liquid with a rinse liquid and dry processing which dries the rinse liquid are performed. As the rinse processing, rinse processing that supplies a rinse liquid such as deionized water (DIW) to the surface of the substrate to which the washing liquid is adhered so as to remove the washing liquid on the surface of the substrate can be mentioned. Thereafter, the dry processing is performed that removes the rinse liquid so as to dry the substrate.

In recent years, as a finer pattern has been formed on a substrate, the aspect ratio of a convex portion in a pattern having recesses and projections (the ratio between the height and the width of the convex portion in the pattern) has been increased. Hence, there is a problem of a so-called pattern collapse in which at the time of dry processing, surface tension that acts on a boundary surface between a liquid such as a washing liquid or a rinse liquid entering a concave portion in the pattern and a gas in contact with the liquid pulls and collapses the adjacent convex portions in the pattern.

As a dry technology for preventing the pattern collapse caused by surface tension as described above, for example, Japanese Unexamined Patent Application Publication No. 2013-16699 discloses a method in which a solution is brought into contact with a substrate where a structure (pattern) is formed such that the solution is changed into a solid, in which the solid is used as a support member (solidified body) for the pattern and in which the support member is removed by being changed from a solid phase to a gas phase without the intervention of a liquid phase. This patent literature also discloses that as the support member, a sublimable substance is used which is at least any of a methacrylic resin material, a styrene resin material and a fluorocarbon material.

Japanese Unexamined Patent Application Publication Nos. 2012-243869 and 2013-258272 disclose dry technologies in which the solution of a sublimable substance is supplied onto a substrate, in which a solvent in the solution is dried such the top of the substrate is filled with the solidified body of the sublimable substance and in which thus the solidified body is sublimed. According to these patent literatures, it is assumed that, since surface tension does not act on the boundary surface between the solidified body and a gas in contact with the solidified body, it is possible to reduce the collapse of a pattern caused by surface tension.

Japanese Unexamined Patent Application Publication No. 2015-142069 discloses a dry technology in which the melt of t-butanol (sublimable substance) is supplied to a substrate to which a liquid is adhered, in which t-butanol is solidified on the substrate so as to form a solidified body and in which the solidified body is thereafter removed by being sublimed.

Disadvantageously, however, even in the dry technologies disclosed in Japanese Unexamined Patent Application Publication Nos. 2013-16699, 2012-243869, 2013-258272 and 2015-142069, it is impossible to sufficiently prevent the collapse of a pattern on, for example, a substrate having a pattern which is fine and whose aspect ratio is high (that is, the height of the projection in the pattern is higher than the width of the projection in the pattern). Although there are various causes for the occurrence of a pattern collapse, as one of them, a force acting between a solidified body formed of a sublimable substance and the surface of the pattern can be mentioned. In the interface between the surface of the pattern and the solidified body, ionic bonds, hydrogen bonds, van der Waals' forces and the like act between the molecules of the pattern and the sublimable substance of the solidified body.

Hence, even when the solidified body is changed into a gas state without the intervention of a liquid state, if the sublimation proceeds unevenly, a stress is added to the pattern, and thus a pattern collapse occurs. The forces acting between the solidified body and the surface of the pattern significantly depend on the physical properties of the sublimable substance of the solidified body. Hence, in order to prevent a pattern collapse in sublimation drying on the surface of the fine pattern, it is necessary to select a sublimable substance which is more suitable for sublimation drying.

BRIEF SUMMARY OF THE INVENTION

The present invention is made in view of the foregoing problem, and has an object to provide a substrate treating apparatus and a substrate treating method which can remove a liquid adhered to the surface of a substrate while preventing the collapse of a pattern formed on the surface of the substrate.

In order to solve the aforementioned problem, the substrate treating apparatus according to the present invention is a substrate treating apparatus which is used in dry processing on a pattern-formed surface of a substrate, the substrate treating apparatus comprising a supplying unit which supplies a process liquid containing a sublimable substance in a molten state to the pattern-formed surface of the substrate, a solidifying unit which solidifies the process liquid on the pattern-formed surface so as to form a solidified body; and a sublimating unit which sublimes the solidified body so as to remove the solidified body from the pattern-formed surface, wherein a vapor pressure of the sublimable substance at a temperature of 20 to 25° C. is equal to or more than 5 kPa, and a surface tension thereof at a temperature of 20 to 25° C. is equal to or less than 25 mN/m.

In the configuration described above, for example, when a liquid is present on the pattern-formed surface of the substrate, according to the principle of freeze drying (or sublimation drying), it is possible to remove the liquid while preventing the collapse of the pattern. Specifically, the supplying unit supplies the process liquid to the pattern-formed surface of the substrate so as to replace the liquid with the process liquid. Then, the solidifying unit solidifies the process liquid so as to form the solidified body. Here, as the sublimable substance, a sublimable substance is used whose vapor pressure is equal to or more than 5 kPa and whose surface tension is equal to or less than 25 mN/m (both of them are values in a temperature range of 20 to 25° C.), and thus it is possible to reduce the uneven progress of the sublimation of the sublimable substance in the solidified body. In this way, as compared with a case where the sublimation progresses unevenly, it is possible to reduce a stress applied to the pattern of the substrate. Consequently, for example, as compared with a substrate treating apparatus which uses a conventional sublimable substance such as t-butanol, even in a substrate which includes a pattern surface having a very small aspect ratio, it is possible to reduce the occurrence of the collapse of the pattern.

Here, the "molten state" means that the sublimable substance melts fully or partially and thereby has fluidity so as to be brought into a liquid state. The "sublimable" means that a single substance, a compound or a mixture has the property of changing its phase from a solid phase to a gas phase or from a gas phase to a solid phase without the intervention of a liquid phase, and the "sublimable substance" means a substance which has the sublimable property described above. The "pattern-formed surface" means a surface of a substrate in which a concave/convex pattern is formed in an arbitrary region regardless of the surface being planar, curved or concave/convex. The "solidified body" means a material obtained by the solidification of the process liquid in a liquid state, and for example, when in a state where a liquid present on the substrate is mixed with the process liquid, and the liquid is solidified by the solidifying unit, such a liquid can be included.

In the configuration described above, the surface tension of the sublimable substance at a temperature of 20 to 25° C. is preferably equal to or less than 20 mN/m.

In the configuration described above, the sublimable substance is preferably 1, 1, 2, 2, 3, 3, 4-heptafluorocyclopentane or dodecafluorocyclohexane.

In the configuration described above, it is preferably that the supplying unit supplies, under atmospheric pressure, the process liquid to the pattern-formed surface of the substrate, and the solidifying unit cools, under atmospheric pressure, the process liquid to a freezing point of the sublimable substance or below. In this way, at least in the supplying unit and the solidifying unit, the configuration does not need to have pressure resistance, and thus it is possible to reduce the cost of the device.

In the configuration described above, it is preferably that the sublimable substance has sublimability under atmospheric pressure, and the sublimating unit sublimes the sublimable substance under atmospheric pressure. In this way, as the sublimable substance, a sublimable substance which has the sublimability under atmospheric pressure is used, and thus at least in the sublimating unit, the configuration does not need to have pressure resistance, and thus it is possible to reduce the cost of the device.

In the configuration described above, at least either one of the solidifying unit and the sublimating unit may be a coolant supplying unit which supplies a coolant at a temperature equal to or below the freezing point of the sublimable substance toward a back surface on a side opposite to the pattern-formed surface of the substrate.

In the configuration described above, in the solidifying unit, the coolant having a temperature equal to or below the freezing point of the sublimable substance is supplied toward the back surface on the side opposite to the pattern-formed surface of the substrate, and thus it is possible to cool the sublimable substance so as to solidify it. In the sublimating unit, the coolant is supplied toward the back surface of the substrate, and thus it is possible to naturally sublime the solidified body while preventing the melting of the solidified body from the side of the back surface of the substrate. Furthermore, both in the solidifying unit and in the sublimating unit, when a configuration in which the coolant can be supplied to the back surface of the substrate is adopted, the number of components is reduced, with the result that it is possible to reduce the cost of the device.

In the configuration described above, at least either one of the solidifying unit and the sublimating unit may be a gas supplying unit which supplies, at a temperature equal to or below the freezing point of the sublimable substance, a gas that is inert to at least the sublimable substance toward the pattern-formed surface.

In the configuration described above, the gas supplying unit supplies, as the solidifying unit, inert gas having a temperature equal to or below the freezing point of the sublimable substance toward the pattern-formed surface, and thus it is possible to cool the sublimable substance so as to solidify it. The gas supplying unit also supplies the inert gas to the solidified body formed on the pattern-formed surface, and thereby can sublime the solidified body, with the result that the gas supplying unit can be made to function as the sublimating unit. Furthermore, the gas supplying unit can be used both as the solidifying unit and as the sublimating unit, and thus it is possible to reduce the number of components, with the result that it is possible to reduce the cost of the device. Since the inert gas is inert to the sublimable substance, the sublimable substance is prevented from being degenerated.

In the configuration described above, the sublimating unit may be a gas supplying unit which supplies, at a temperature equal to or below the freezing point of the sublimable substance, an inert gas that is inert to at least the sublimable substance toward the pattern-formed surface and a coolant supplying unit which supplies a coolant at a temperature equal to or below the freezing point of the sublimable substance toward a back surface on a side opposite to the pattern-formed surface of the substrate.

In the configuration described above, the gas supplying unit supplies, to the solidified body formed on the pattern-formed surface, inert gas at a temperature equal to or below the freezing point of the sublimable substance, and thus the solidified body is sublimed. The coolant supplying unit supplies, to the back surface on the side opposite to the pattern-formed surface of the substrate, the coolant at a temperature equal to or below the freezing point of the sublimable substance, and thus it is possible to prevent the melting of the solidified body from the side of the back surface of the substrate.

In the configuration described above, the sublimating unit is preferably a pressure reducing unit which reduces a pressure of the pattern-formed surface on which the solidified body is formed to an environment lower than atmospheric pressure.

As the sublimating unit, a pressure reducing unit is used, and thus the pattern-formed surface of the substrate is brought into an environment lower than atmospheric pressure, with the result that it is possible to sublime the sublimable substance in the solidified body. Here, when the sublimable substance is sublimed from the solidified body so as to be evaporated, the solidified body is deprived of heat as sublimation heat. Thus, the solidified body is cooled. Hence, even under a temperature environment slightly higher than the melting point of the sublimable substance, the solidified body can be maintained at a temperature lower than the melting point of the sublimable substance without being additionally cooled. Consequently, it is possible to sublime the solidified body while preventing the melting of the sublimable substance in the solidified body. Since it is not necessary to additionally provide a cooling mechanism, it is possible to reduce the costs of the device and the processing.

In the configuration described above, the solidifying unit is preferably the pressure reducing unit which reduces the pressure of the pattern-formed surface to which the process liquid is supplied to an environment lower than atmospheric pressure.

In this configuration, the pressure reducing unit is used as the solidifying unit, and thus the pattern-formed surface of the substrate is brought into an environment lower than atmospheric pressure such that the process liquid is evaporated, with the result that the process liquid is cooled by the heat of the evaporation so as to be able to be solidified. Since it is not necessary to additionally provide a cooling mechanism, it is possible to reduce the costs of the device and the processing.

In this configuration described above, the pressure reducing unit is preferably used as the sublimating unit. In this configuration, the pressure reducing unit which is used as the solidifying unit is also used as the sublimating unit, and thus it is possible to reduce the number of components, with the result that it is possible to reduce the cost of the device.

In this configuration, it is preferably that the supplying unit includes a process liquid temperature adjustment portion which adjusts a temperature of the process liquid such that the temperature of the process liquid is equal to or above a melting point of the sublimable substance and below a boiling point thereof. In the configuration described above, the supplying unit further includes the process liquid temperature adjustment portion, and thus the temperature of the process liquid can be adjusted so as to be equal to or above the melting point of the sublimable substance and below the boiling point. The temperature of the process liquid is set equal to or above the melting point of the sublimable substance, and thus it is possible to satisfactorily perform dry processing on the liquid on the substrate while further preventing the collapse of the pattern formed on the substrate.

In order to solve the above-mentioned problems, the substrate treating method of the present invention includes: a substrate treating method of performing dry processing on a pattern-formed surface of a substrate, the substrate treating method comprising: a supplying step of supplying a process liquid containing a sublimable substance in a molten state to the pattern-formed surface of the substrate; a solidifying step of solidifying the process liquid on the pattern-formed surface so as to form a solidified body; and a sublimating step of subliming the solidified body so as to remove the solidified body from the pattern-formed surface, wherein a vapor pressure of the sublimable substance at a temperature of 20 to 25° C. is equal to or more than 5 kPa, and a surface tension thereof at a temperature of 20 to 25° C. is equal to or less than 25 mN/m.

In the configuration described above, for example, when a liquid is present on the pattern-formed surface of the substrate, according to the principle of freeze drying (or sublimation drying), it is possible to remove the liquid while preventing the collapse of the pattern. Specifically, in the supplying step, the process liquid is supplied to the pattern-formed surface of the substrate so as to replace the liquid with the process liquid. Then, in the solidifying step, the process liquid is solidified so as to form the solidified body. Here, as the sublimable substance, a sublimable substance is used whose vapor pressure is equal to or more than 5 kPa and whose surface tension is equal to or less than 25 mN/m (both of them are values in a temperature range of 20 to 25° C.), and thus in the sublimating step, it is possible to make the progress of the sublimation of the sublimable substance in the solidified body even. In this way, as compared with a case where the sublimation progresses unevenly, it is possible to reduce a stress applied to the pattern of the substrate. Consequently, for example, as compared with a substrate treating method which uses a conventional sublimable substance such as t-butanol, even in a substrate which includes a pattern surface having a very small aspect ratio, it is possible to further reduce the occurrence of the collapse of the pattern.

In the configuration described above, the surface tension of the sublimable substance at a temperature of 20 to 25° C. is preferably equal to or less than 20 mN/m.

In this configuration, the sublimable substance is preferably 1, 1, 2, 2, 3, 3, 4-heptafluorocyclopentane or dodecafluorocyclohexane.

The present invention has effects which will be described below by the means described above.

Specifically, in the present invention, for example, when a liquid is present on the pattern-formed surface of the substrate, the liquid is replaced by the process liquid containing the sublimable substance, thereafter the process liquid is solidified so as to form the solidified body and the sublimable substance in the solidified body is sublimed, with the result that dry processing is performed on the liquid on the substrate. Here, in the present invention, as the sublimable substance, a sublimable substance is used whose vapor pressure (20 to 25° C.) is equal to or more than 5 kPa and whose surface tension (20 to 25° C.) is equal to or less than 25 mN/m, and thus it is possible to make the progress of the sublimation of the sublimable substance even. In this way, in the present invention, it is possible to reduce the application of a stress to the pattern due to the uneven process of the sublimation. Consequently, in the present invention, for example, as compared with the substrate treating apparatus and the substrate treating method using conventional sublimable substances such as t-butanol, it is possible to further reduce the collapse of the pattern, with the result that the present invention is extremely suitable for dry processing of liquid on substrates.

DETAILED DESCRIPTION OF THE INVENTION

First Embodiment

A first embodiment of the present invention will be described below.

Figure 1:
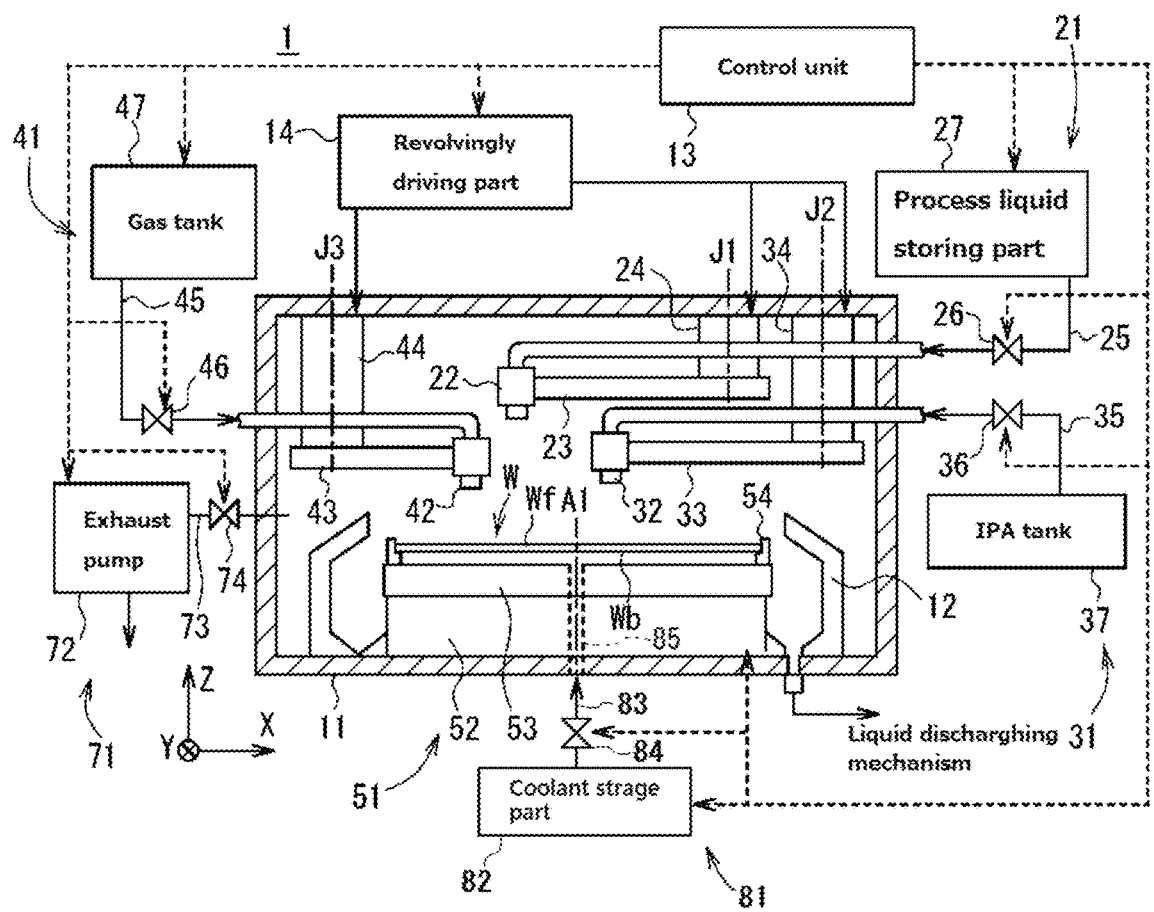
FIG. 1 is an illustrative diagram schematically showing a substrate treating apparatus according to a first embodiment of the present invention.
Figure 2:
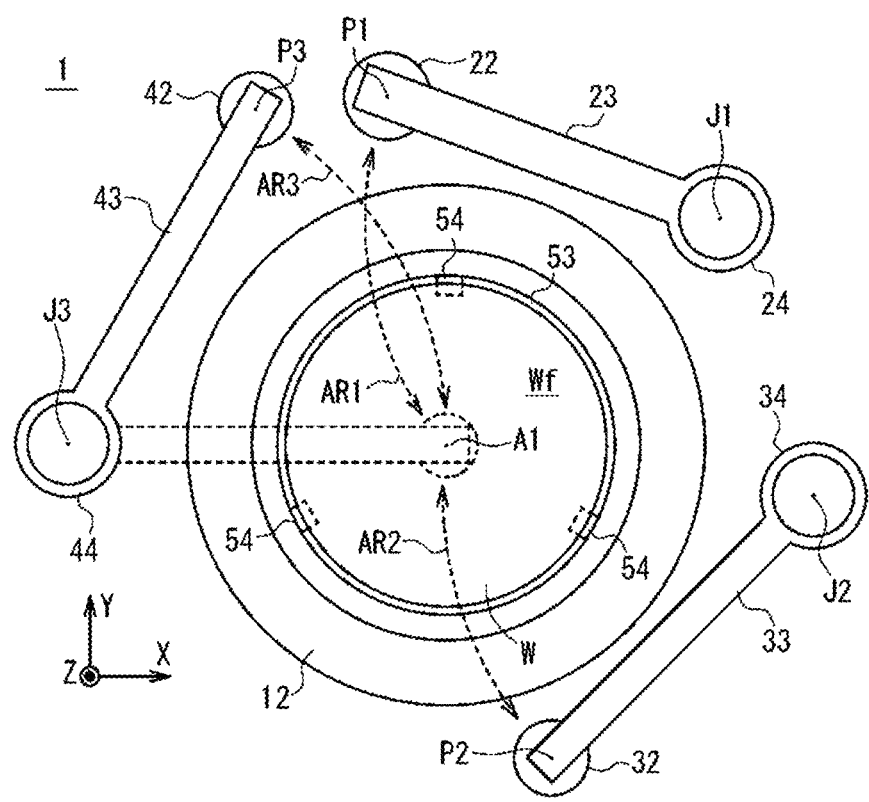
FIG. 2 is a schematic plan view showing the substrate treating apparatus.

FIG. 1 is an illustrative diagram schematically showing a substrate treating apparatus 1 according to the present embodiment. FIG. 2 is a schematic plan view showing the internal configuration of the substrate treating apparatus 1. In individual figures, in order to clarify the relationship of directions shown in the figures, XYZ orthogonal coordinate axes are shown as necessary. In FIGS. 1 and 2, an XY plane indicates a horizontal plane, and a +Z direction indicates a vertically upward direction.

The substrate treating apparatus 1 can be used for processing on various types of substrates. The "substrates" described above refer to various types of substrates such as a semiconductor substrate, a photomask glass substrate, a liquid crystal display glass substrate, a plasma display glass substrate, an FED (Field Emission Display) substrate, an optical disc substrate, a magnetic disc substrate and a magneto-optical disc substrate. In the present embodiment, a description will be given using, as an example, a case where the substrate treating apparatus 1 is used for processing on a semiconductor substrate (hereinafter referred to as a "substrate W").

As an example of the substrate W, a substrate is used in which a circuit pattern and the like (hereinafter referred to as a "pattern") are formed on only one main surface. Here, a pattern-formed surface (main surface) on which the pattern is formed is referred to as a "front surface", and a main surface on the opposite side on which the pattern is not formed is referred to as a "back surface". The surface of the substrate which is directed downward is referred to as a "lower surface", and the surface of the substrate which is directed upward is referred to as an "upper surface". A description will be given below with the assumption that the upper surface is the front surface.

The shape of the pattern described above is not particularly limited, and for example, the pattern in the shape of a line or a cylinder can be mentioned. The size of the pattern is not particularly limited, and can be arbitrarily set as necessary. Furthermore, the material of the pattern is not particularly limited, and a metal, an insulating material or the like can be mentioned.

The substrate treating apparatus 1 is a single-wafer type substrate treating apparatus which is used in washing processing (including rinse processing) for removing contaminants such as particles adhered to the substrate W and dry processing after the washing processing. Although in FIGS. 1 and 2, only portions used in the dry processing are shown, and a nozzle and the like for washing used in the washing processing are not shown, the substrate treating apparatus 1 may include the nozzle and the like.

<1-1 Configuration of Substrate Treating Apparatus>

The configuration of the substrate treating apparatus 1 will first be described with reference to FIGS. 1 and 2.

The substrate treating apparatus 1 includes at least a chamber 11 which is a container for storing the substrate W, a substrate holder 51 which holds the substrate W, a control unit 13 which controls the individual portions of the substrate treating apparatus 1, a process liquid supplying unit (supplying unit) 21 which supplies a dry assistant liquid as a process liquid to the substrate W held in the substrate holder 51, an IPA supplying unit 31 which supplies IPA (isopropyl alcohol) to the substrate W held in the substrate holder 51, a gas supplying unit 41 (solidifying unit, sublimating unit) which supplies a gas to the substrate W held in the substrate holder 51, a scattering prevention cup 12 which collects the IPA, the dry assistant liquid and the like that are supplied to the substrate W held in the substrate holder 51 and that are discharged to the outside of the peripheral portion of the substrate W, a revolvingly driving part 14 which individually and independently turns and drives arms to be described later in the portions of the substrate treating apparatus 1, a pressure reducing unit 71 which reduces the pressure within the chamber 11 and a coolant supplying unit (solidifying unit, sublimating unit) 81 which supplies a coolant to the back surface Wb of the substrate W. The substrate treating apparatus 1 also includes a substrate carrying-in/out unit, a chuck pin opening/closing mechanism and a wet washing unit (all of which are not illustrated). The individual portions of the substrate treating apparatus 1 will be described below.

The substrate holder 51 includes a rotarily driving part 52, a spin base 53 and chuck pins 54. The spin base 53 has a planar size slightly larger than the substrate W. In the vicinity of the peripheral portion of the spin base 53, a plurality of chuck pins 54 which grasp the peripheral portion of the substrate W are provided so as to stand. Although the number of chuck pins 54 installed is not particularly limited, at least three or more chuck pins 54 are preferably provided in order to reliably hold the circular substrate W. In the present embodiment, along the peripheral portion of the spin base 53, three chuck pins 54 are arranged at equal intervals (see FIG. 2). Each of the chuck pins 54 includes a substrate support pin which supports the peripheral portion of the substrate W from below and a substrate hold pin which presses the outer circumferential end surface of the substrate W supported by the substrate support pin so as to hold the substrate W.

Each of the chuck pins 54 can be switched between a pressed state where the substrate hold pin presses the outer circumferential end surface of the substrate W and a released state where the substrate hold pin is separated from the outer circumferential end surface of the substrate W, and the switching of the states is performed according to an operation instruction from the control unit 13 which controls the entire device.

More specifically, when the substrate W is loaded or unloaded with respect to the spin base 53, the individual chuck pins 54 are brought into the released state whereas when substrate processing to be described later from washing processing to sublimation processing is performed on the substrate W, the individual chuck pins 54 are brought into the pressed state. When the chuck pin 54 is brought into the pressed state, the chuck pin 54 grasps the peripheral portion of the substrate W such that the substrate W is held in a horizontal posture (XY plane) a predetermined distance apart from the spin base 53. In this way, the substrate W is held horizontally in a state where its front surface Wf is directed upward.

Although as described above, in the present embodiment, the substrate W is held by the spin base 53 and the chuck pins 54, the substrate holding method is not limited to this method. For example, the back surface Wb of the substrate W may be held by an adsorption method with a spin chuck or the like.

The spin base 53 is coupled to the rotarily driving part 52. The rotarily driving part 52 is rotated about an axis A1 along the Z direction by the operation instruction of the control unit 13. The rotarily driving part 52 is formed with a belt, a motor and a rotation shaft which are known. The rotarily driving part 52 is rotated about the axis A1, and thus the substrate W held by the chuck pins 54 above the spin base 53 is rotated about the axis A1 together with the spin base 53.

Next, the process liquid supplying unit (supplying unit) 21 will be described.

The process liquid supplying unit 21 is a unit which supplies the dry assistant liquid to the pattern-formed surface of the substrate W, and includes, as shown in FIG. 1, at least a nozzle 22, an arm 23, a turning shaft 24, a pipe 25, a valve 26 and a process liquid storage part 27.

Figure 3A:
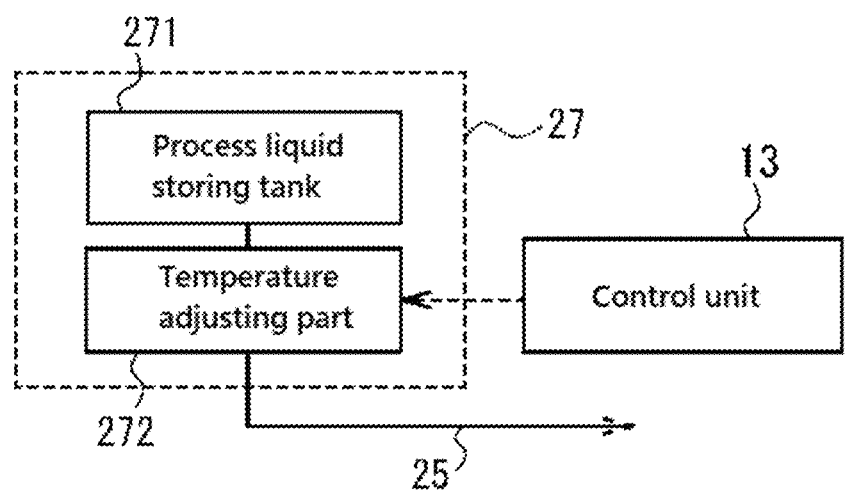
FIG. 3A is a block diagram showing a schematic configuration of a dry assistant liquid storage portion in the substrate treating apparatus.
Figure 3B:
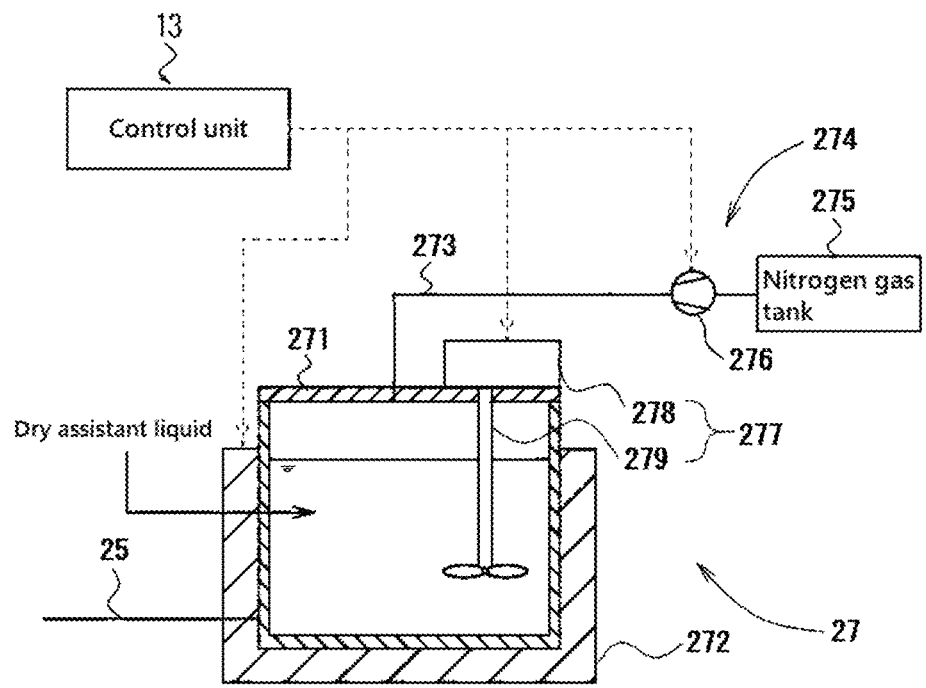
FIG. 3B is an illustrative diagram showing a specific configuration of the dry assistant liquid storage portion.

As shown in FIGS. 3A and 3B, the process liquid storage part 27 includes at least a process liquid storing tank 271, an agitation part 277 which agitates the dry assistant liquid within the process liquid storing tank 271, a pressurization part 274 which pressurizes the process liquid storing tank 271 so as to feed out the dry assistant liquid and a (process liquid) temperature adjusting part 272 which heats the dry assistant liquid within the process liquid storing tank 271. FIG. 3A is a block diagram showing a schematic configuration of the process liquid storage part 27, and FIG. 3B is an illustrative diagram showing a specific configuration of the process liquid storage part 27.

The agitation part 277 includes a rotation part 279 which agitates the dry assistant liquid within the process liquid storing tank 271 and an agitation control part 278 which controls the rotation of the rotation part 279. The agitation control part 278 is electrically connected to the control unit 13. The rotation part 279 has a propeller-shaped agitation blade at a tip end of the rotation shaft (the lower end of the rotation part 279 in FIG. 4), the control unit 13 provides the operation instruction to the agitation control part 278 such that the rotation part 279 is rotated, and thus the dry assistant liquid is agitated by the agitation blade, with the result that the concentration and temperature of a dry auxiliary substance and the like in the dry assistant liquid are made uniform.

The method of making the concentration and temperature of the dry assistant liquid within the process liquid storing tank 271 uniform is not limited to the method described above, and a known method such as a method of additionally providing a circulation pump to circulate the dry assistant liquid can be used.

The pressurization part 274 is formed with a nitrogen gas tank 275 which is the supply source of a gas for pressurizing the interior of the process liquid storing tank 271, a pump 276 which pressurizes nitrogen gas and a pipe 273. The nitrogen gas tank 275 is connected through the pipe 273 with the pipeline to the process liquid storing tank 271, and the pump 276 is interposed in the pipe 273.

The temperature adjusting part 272 is electrically connected to the control unit 13, and heats, by the operation instruction of the control unit 13, the dry assistant liquid stored in the process liquid storing tank 271 so as to perform temperature adjustment. The temperature adjustment is preferably performed such that the temperature of the dry assistant liquid is equal to or above the melting point of the dry auxiliary substance (sublimable substance the details of which will be described later) contained in the dry assistant liquid. In this way, it is possible to maintain the molten state of the dry auxiliary substance. The upper limit of the temperature adjustment is preferably a temperature which is lower than the boiling point. The temperature adjusting part 272 is not particularly limited, and for example, a known temperature adjustment mechanism can be used such as a resistance heater, a Peltier element or a pipe through which water whose temperature is adjusted is passed. In the present embodiment, the configuration of the temperature adjusting part 272 is arbitrary. For example, when an environment in which the substrate treating apparatus 1 is installed is an environment whose temperature is higher than the melting point of the sublimable substance, since it is possible to maintain the molten state of the sublimable substance, it is not necessary to heat the dry assistant liquid. Consequently, the temperature adjusting part 272 can be omitted.

With reference back to FIG. 1, the process liquid storage part 27 (more specifically, the process liquid storing tank 271) is connected through the pipe 25 with the pipeline to the nozzle 22, and the valve 26 is interposed partway through the path of the pipe 25.

An air pressure sensor (unillustrated) is provided within the process liquid storing tank 271, and is electrically connected to the control unit 13. The control unit 13 controls, based on a value detected by the air pressure sensor, the operation of the pump 276 so as to keep the air pressure within the process liquid storing tank 271 at a predetermined air pressure higher than atmospheric pressure. On the other hand, the valve 26 is also electrically connected to the control unit 13, and is normally closed. The opening and closing of the valve 26 is also controlled by the operation instruction of the control unit 13. When the control unit 13 provides the operation instruction to the process liquid supplying unit 21 so as to open the valve 26, the dry assistant liquid is fed by pressure from the interior of the process liquid storing tank 271 which is pressurized, and is discharged through the pipe 25 from the nozzle 22. In this way, it is possible to supply the dry assistant liquid to the front surface Wf of the substrate W. Since the process liquid storing tank 271 uses, as described above, the pressure caused by the nitrogen gas to feed the dry assistant liquid, the process liquid storing tank 271 is preferably configured so as to be airtight.

The nozzle 22 is attached to the tip end portion of the arm 23 which is provided so as to be extended horizontally, and is arranged above the spin base 53. The back end portion of the arm 23 is supported by the turning shaft 24 provided so as to be extended in the Z direction such that back end portion of the arm 23 is freely rotated about an axis J1, and the turning shaft 24 is provided so as to be fixed within the chamber 11. The arm 23 is coupled through the turning shaft 24 to the revolvingly driving part 14. The revolvingly driving part 14 is electrically connected to the control unit 13, and turns the arm 23 about the axis J1 by the operation instruction from the control unit 13. As the arm 23 is turned, the nozzle 22 is also moved.

As indicated by solid lines in FIG. 2, the nozzle 22 is normally located outside the peripheral portion of the substrate W, and is arranged in a retraction position P1 outside the scattering prevention cup 12. When the arm 23 is turned by the operation instruction of the control unit 13, the nozzle 22 is moved along the path of an arrow AR1 so as to be arranged in a position above the center portion (the axis A1 or the vicinity thereof) of the front surface Wf of the substrate W.

With reference back to FIG. 1, the IPA supplying unit 31 will be described. The IPA supplying unit 31 is a unit which supplies the IPA to the substrate W, and includes a nozzle 32, an arm 33, a turning shaft 34, a pipe 35, a valve 36 and an IPA tank 37.

The IPA tank 37 is connected through the pipe 35 with the pipeline to the nozzle 32, and the valve 36 is interposed partway through the path of the pipe 35. In the IPA tank 37, the IPA is stored, the IPA within the IPA tank 37 is pressurized by an unillustrated pressurization and thus the IPA is fed from the pipe 35 in the direction of the nozzle 32.

The valve 36 is electrically connected to the control unit 13, and is normally closed. The opening and closing of the valve 36 is controlled by the operation instruction of the control unit 13. When the valve 36 is opened by the operation instruction of the control unit 13, the IPA is passed through the pipe 35 and is supplied from the nozzle 32 to the front surface Wf of the substrate W.

The nozzle 32 is attached to the tip end portion of the arm 33 which is provided so as to be extended horizontally, and is arranged above the spin base 53. The back end portion of the arm 33 is supported by the turning shaft 34 provided so as to be extended in the Z direction such that the back end portion of the arm 33 is freely rotated about an axis J2, and the turning shaft 34 is provided so as to be fixed within the chamber 11. The arm 33 is coupled through the turning shaft 34 to the revolvingly driving part 14. The revolvingly driving part 14 is electrically connected to the control unit 13, and turns the arm 33 about the axis J2 by the operation instruction from the control unit 13. As the arm 33 is turned, the nozzle 32 is also moved.

As indicated by solid lines in FIG. 2, the nozzle 32 is normally located outside the peripheral portion of the substrate W, and is arranged in a retraction position P2 outside the scattering prevention cup 12. When the arm 33 is turned by the operation instruction of the control unit 13, the nozzle 32 is moved along the path of an arrow AR2 so as to be arranged in a position above the center portion (the axis A1 or the vicinity thereof) of the front surface Wf of the substrate W.

Although in the present embodiment, IPA is used in the IPA supplying unit 31, as long as a liquid is used which is soluble in the dry auxiliary substance and deionized water (DIW), in the present invention, there is no limitation to IPA. Examples of a replacement of the IPA in the present embodiment include methanol, ethanol, acetone, benzene, carbon tetrachloride, chloroform, hexane, decalin, tetralin, acetic acid, cyclohexanol, ether and hydrofluoroether (Hydro Fluoro Ether).

Next, with reference back to FIG. 1, the gas supplying unit 41 will be described. The gas supplying unit 41 is a unit which supplies a gas to the substrate W, and includes a nozzle 42, an arm 43, a turning shaft 44, a pipe 45, a valve 46 and a gas tank 47.

Figure 4:
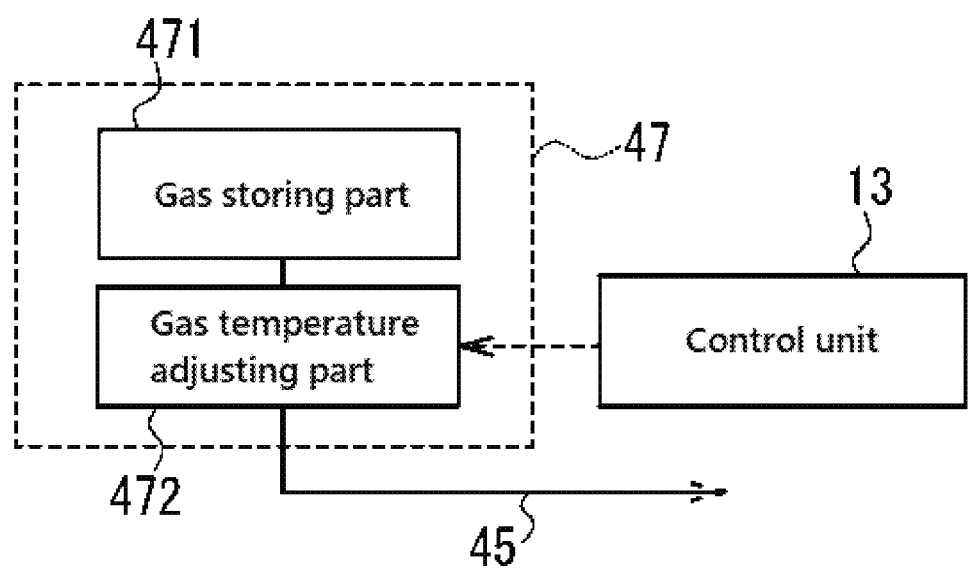
FIG. 4 is a block diagram showing a schematic configuration of a gas tank in the substrate treating apparatus.

FIG. 4 is a block diagram showing a schematic configuration of the gas tank 47. The gas tank 47 includes a gas storing part 471 which stores a gas and a gas temperature adjusting part 472 which adjusts the temperature of the gas stored in the gas storing part 471. The gas temperature adjusting part 472 is electrically connected to the control unit 13, and heats or cools the gas stored in the gas storing part 471 by the operation instruction of the control unit 13 so as to perform temperature adjustment. The temperature adjustment is preferably performed such that the gas stored in the gas storing part 471 has a low temperature which is equal to or below the freezing point of the dry auxiliary substance.

The gas temperature adjusting part 472 is not particularly limited, and for example, a known temperature adjustment mechanism can be used such as a Peltier element or a pipe through which water whose temperature is adjusted is passed.

With reference back to FIG. 1, the gas tank 47 (more specifically, the gas storing part 471) is connected through the pipe 45 with the pipeline to the nozzle 42, and the valve 46 is interposed partway through the path of the pipe 45. The gas within the gas tank 47 is pressurized by an unillustrated pressurization so as to be fed to the pipe 45. Since the pressurization can be realized by pressurization with a pump or the like or by compressing and storing the gas into the gas tank 47, any pressurization may be used.

The valve 46 is electrically connected to the control unit 13, and is normally closed. The opening and closing of the valve 46 is controlled by the operation instruction of the control unit 13. When the valve 46 is opened by the operation instruction of the control unit 13, the gas is passed through the pipe 45 and is supplied from the nozzle 42 to the front surface Wf of the substrate W.

The nozzle 42 is attached to the tip end portion of the arm 43 which is provided so as to be extended horizontally, and is arranged above the spin base 53. The back end portion of the arm 43 is supported by the turning shaft 44 provided so as to be extended in the Z direction such that the back end portion of the arm 43 is freely rotated about an axis J3, and the turning shaft 44 is provided so as to be fixed within the chamber 11. The arm 43 is coupled through the turning shaft 44 to the revolvingly driving part 14. The revolvingly driving part 14 is electrically connected to the control unit 13, and turns the arm 43 about the axis J3 by the operation instruction from the control unit 13. As the arm 43 is turned, the nozzle 42 is also moved.

As indicated by solid lines in FIG. 2, the nozzle 42 is normally located outside the peripheral portion of the substrate W, and is arranged in a retraction position P3 outside the scattering prevention cup 12. When the arm 43 is turned by the operation instruction of the control unit 13, the nozzle 42 is moved along the path of an arrow AR3 so as to be arranged in a position above the center portion (the axis A1 or the vicinity thereof) of the front surface Wf of the substrate W. How the nozzle 42 is arranged in the position above the center portion of the front surface Wf is indicated by dotted lines in FIG. 2.

In the gas storing part 471, an inert gas which is inert to at least the dry auxiliary substance, more specifically, nitrogen gas, is stored. The nitrogen gas stored is adjusted in the gas temperature adjusting part 472 such that its temperature is equal to or below the freezing point of the dry auxiliary substance. The temperature of the nitrogen gas is not particularly limited as long as the temperature is equal to or below the freezing point of the dry auxiliary substance, and the temperature of the nitrogen gas can be normally set within a range equal to or more than 0° C. and equal to or less than 15° C. The temperature of the nitrogen gas is set equal to or more than 0° C., and thus, for example, it is possible to prevent water vapor present within the chamber 11 from being solidified and adhered to the front surface Wf of the substrate W, with the result that it is possible to prevent the substrate W from being adversely affected.

The nitrogen gas used in the first embodiment is preferably a dry gas whose dew point is equal to or less than 0° C. When the nitrogen gas is sprayed to a solidified body under an atmospheric pressure environment, the dry auxiliary substance in the solidified body is sublimed into the nitrogen gas. Since the nitrogen gas is continuously supplied to the solidified body, the partial pressure of the dry auxiliary substance in a gaseous state produced by the sublimation in the nitrogen gas is kept lower than the saturated vapor pressure of the dry auxiliary substance in the gaseous state at the temperature of the nitrogen gas, and thus at least the surface of the solidified body is filled under an atmosphere in which the dry auxiliary substance in the gaseous state is present at the saturated vapor pressure or less.

Although in the present embodiment, as the gas supplied by the gas supplying unit 41, nitrogen gas is used, as long as the gas is inert to the dry auxiliary substance, there is no limitation to the gas in the practice of the present invention. Examples of a replacement of the nitrogen gas include argon gas, helium gas and dry air (a gas having a nitrogen gas concentration of 80% and an oxygen gas concentration of 20%). Alternatively, a mixture gas obtained by mixing a plurality of types of gases described above may be used.

With reference back to FIG. 1, the pressure reducing unit 71 is a means which reduces the interior of the chamber 11 in pressure to an environment lower than atmospheric pressure, and includes an exhaust pump 72, a pipe 73 and a valve 74. The exhaust pump 72 is a known pump which is connected through the pipe 73 with the pipeline to the chamber 11 and which applies pressure to the gas. The exhaust pump 72 is electrically connected to the control unit 13, and is normally in a stop state. The drive of the exhaust pump 72 is controlled by the operation instruction of the control unit 13. The valve 74 is interposed in the pipe 73.

The valve 74 is electrically connected to the control unit 13, and is normally closed. The opening and closing of the valve 74 is controlled by the operation instruction of the control unit 13.

When the exhaust pump 72 is driven by the operation instruction of the control unit 13, and the valve 74 is opened, the gas present within the chamber 11 is exhausted by the exhaust pump 72 through the pipe 73 to the outside of the chamber 11.

The scattering prevention cup 12 is provided so as to surround the spin base 53. The scattering prevention cup 12 is connected to an unillustrated raising/lowering mechanism so as to be able to be raised and lowered in the Z direction. When the dry assistant liquid and the IPA are supplied to the substrate W, the scattering prevention cup 12 is located by the raising/lowering mechanism in a predetermined position as shown in FIG. 1 so as to surround, from lateral positions, the substrate W held by the chuck pins 54. In this way, it is possible to collect liquids such as the dry assistant liquid and the IPA scattered from the substrate W or the spin base 53.

Next, the coolant supplying unit 81 will be described.

The coolant supplying unit 81 is a unit which supplies the coolant to the back surface Wb of the substrate W, and includes, as shown in FIG. 1, at least a coolant storage part 82, a pipe 83, a valve 84 and a coolant supply pipe 85.

Figure 5:
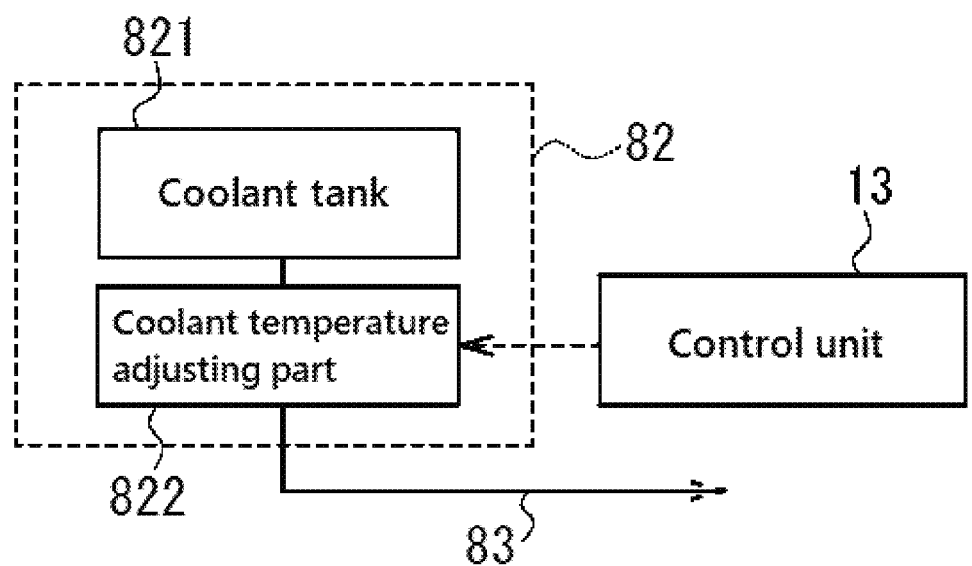
FIG. 5 is a block diagram showing a schematic configuration of a coolant storage part in the substrate treating apparatus.

FIG. 5 is a block diagram showing a schematic configuration of the coolant storage part 82. The coolant storage part 82 includes a coolant tank 821 which stores the coolant and a coolant temperature adjusting part 822 which adjusts the temperature of the coolant stored in the coolant tank 821.

The coolant temperature adjusting part 822 is electrically connected to the control unit 13, and heats or cools the coolant stored in the coolant tank 821 by the operation instruction of the control unit 13 so as to perform temperature adjustment. The temperature adjustment is preferably performed such that the coolant stored in the coolant tank 821 has a low temperature which is equal to or below the freezing point of the dry auxiliary substance. The coolant temperature adjusting part 822 is not particularly limited, and for example, a known temperature adjustment mechanism can be used such as a chiller using a Peltier element or a pipe through which water whose temperature is adjusted is passed.

With reference back to FIG. 1, the coolant storage part 82 is connected through the pipe 83 with the pipeline to the coolant supply pipe 85, and the valve 84 is interposed partway through the path of the pipe 83. The coolant supply pipe 85 is provided by forming a through hole in the center portion of the spin base 53. The coolant within the coolant storage part 82 is pressurized by an unillustrated pressurization so as to be fed to the pipe 82. Since the pressurization can be realized by pressurization with a pump or the like or by compressing and storing the gas into the coolant storage part 82, any pressurization may be used.

The valve 84 is electrically connected to the control unit 13, and is normally closed. The opening and closing of the valve 84 is controlled by the operation instruction of the control unit 13. When the valve 84 is opened by the operation instruction of the control unit 13, the coolant is passed through the pipe 83 and the coolant supply pipe 85 and is supplied to the back surface Wb of the substrate W.

As the coolant, a liquid or a gas whose temperature is equal to or below the freezing point of the dry auxiliary substance can be mentioned. Furthermore, the liquid is not particularly limited, and for example, cold water having a temperature of 7° C. or the like can be mentioned. The gas is not particularly limited, and for example, an inert gas which is inert to the dry auxiliary substance, more specifically, nitrogen gas having a temperature of 7° C. or the like can be mentioned.

Figure 6:
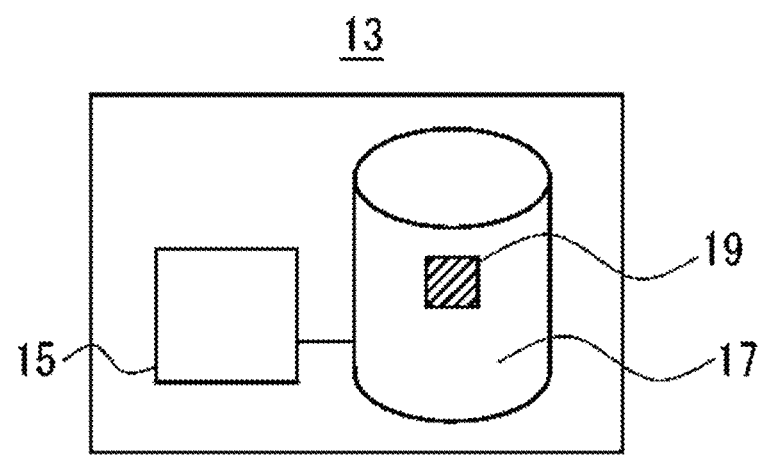
FIG. 6 is an illustrative diagram showing a schematic configuration of a control unit in the substrate treating apparatus.

FIG. 6 is a schematic view showing the configuration of the control unit 13. The control unit 13 is electrically connected to the individual portions of the substrate treating apparatus 1 (see FIG. 1), and controls the operations of the individual portions. The control unit 13 is formed with a computer which includes a computation processing part 15 and a memory 17. As the computation processing part 15, a CPU which performs various types of computation processing is used. The memory 17 includes a ROM which is a read-only memory for storing basic programs, a RAM which is a readable and writable memory for storing various types of information and a magnetic disc for storing control software, data or the like. In the magnetic disc, substrate processing conditions (recipes) corresponding to the substrate W are previously stored. The CPU reads the substrate processing conditions on the RAM so as to control the individual portions of the substrate treating apparatus 1 according to the details thereof.

<1-2 Dry Assistant Liquid>

Next, the dry assistant liquid used in the present embodiment will be described below.

The dry assistant liquid of the present embodiment is a process liquid which contains the dry auxiliary substance (sublimable substance) in a molten state, and in dry processing for removing liquid present on the pattern-formed surface of the substrate, the dry assistant liquid functions to assist the dry processing. The sublimable substance has the property of changing its phase from a solid phase to a gas phase or from a gas phase to a solid phase without the intervention of a liquid phase. Since the sublimable substance in the molten state is contained in the dry assistant liquid, it is possible to form, on the substrate W, a solidified body in the shape of a film having a uniform layer thickness.

In the present embodiment, the vapor pressure of the sublimable substance in a range of 20 to 25° C. is equal to or more than 5 kPa, is preferably equal to or more than 8 kPa and equal to or less than 100 kPa and is more preferably equal to or more than 15 kPa and equal to or less than 100 kPa. The surface tension of the sublimable substance in the range of 20 to 25° C. is equal to or less than 25 mN/m, is preferably less than 20 mN/m, is more preferably more than 0 mN/m and equal to or less than 15 mN/m and is further preferably equal to or more than 0 mN/m and equal to or less than 13 mN/m. The sublimable substance is used whose vapor pressure is equal to or more than 5 kPa and whose surface tension is equal to or less than 25 mN/m, and thus it is possible to reduce the uneven progress of the sublimation of the sublimable substance in the solidified body, with the result that it is possible to reduce the collapse of the pattern. For example, for a pattern in which on the substrate, a plurality of cylinders (with an aspect ratio of 16) having a diameter of 30 nm and a height of 480 nm are aligned at intervals of 80 nm, the pattern collapse rate can be reduced to 20% or less. The pattern collapse rate is a value which is calculated from the formula below.

pattern collapse rate(%)=(the number of convex portions collapsed in an arbitrary region)/(the total number of convex portions in the region)×100

In the present embodiment, as the sublimable substance, for example, 1, 1, 2, 2, 3, 3, 4-heptafluorocyclopentane (having a vapor pressure of 8.2 kPa at 20° C., a surface tension of 19.6 mN/m at 25° C. and a melting point of 20.5° C.), dodecafluorocyclohexane (having a vapor pressure of 33.1 kPa at 20° C., a surface tension of 12.6 mN/m at 25° C. (calculated value) and a melting point of 51° C.) and the like can be illustrated. In these sublimable substances, the vapor pressure is high as compared with DIW (having a vapor pressure of 2.3 kPa at 20° C.) and t-butanol (having a vapor pressure of 4.1 kPa at 20° C., a surface tension of 19.56 mN/m at 25° C. and a melting point of 25° C.) which are conventional dry auxiliary substances, and thus it is possible to perform a sublimating step at a sublimation rate higher than in the conventional dry auxiliary substances. These sublimable substances do not contain OH groups and have difficulty in being dissolved in water as compared with t-butanol, and thus they are prevented from being mixed with water left on the substrate W. Consequently, water is prevented from being left between the patterns after the sublimation.

The dry assistant liquid may be formed with only the sublimable substance in the molten state, and the dry assistant liquid may also contain an organic solvent. In this case, the amount of sublimable substance contained with respect to the total mass of the dry assistant liquid is preferably equal to or more than 60 mass % and is more preferably equal to or more than 95 mass %. As long as the organic solvent is compatible with the sublimable substance in the molten state, the organic solvent is not particularly limited. Specifically, for example, alcohols and the like can be mentioned.

<1-3 Substrate Treating Method>

Figure 7:
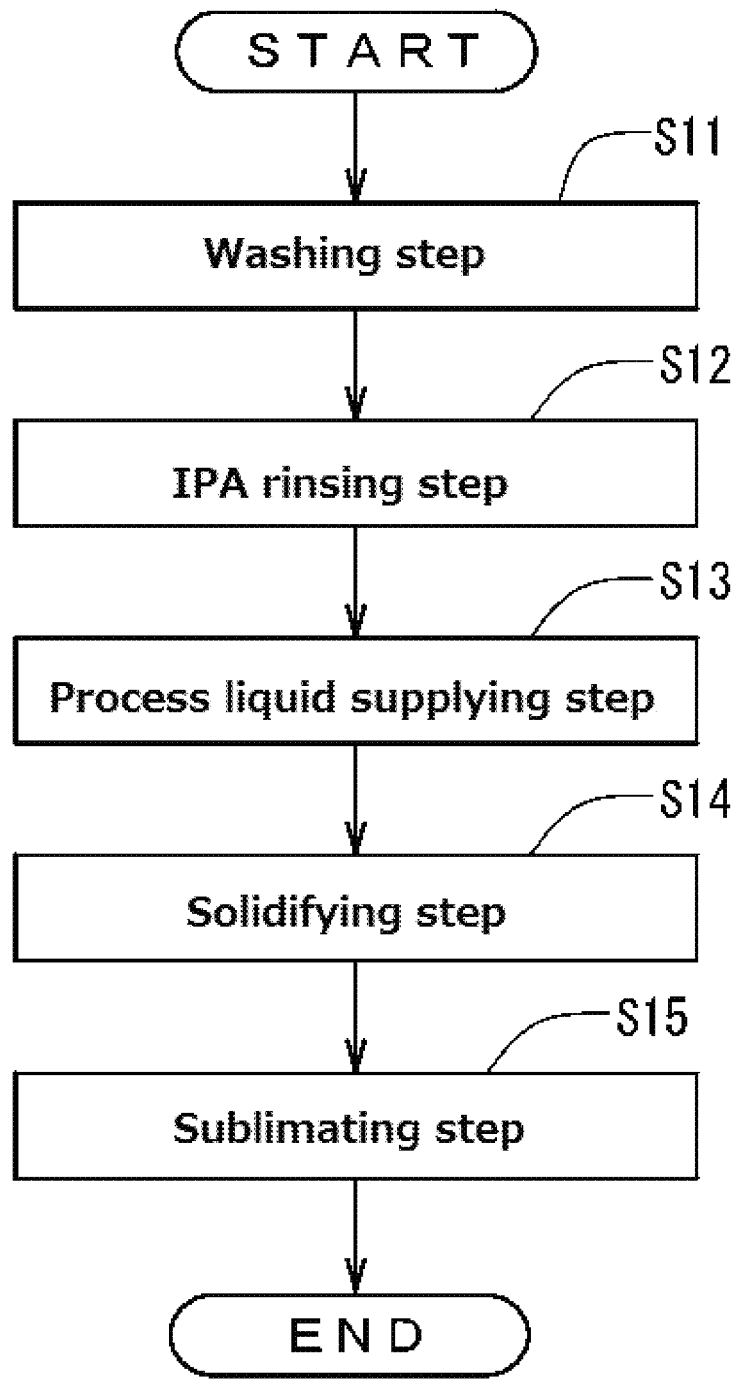
FIG. 7 is a flowchart showing a substrate treating method using the substrate treating apparatus.
Figure 8:
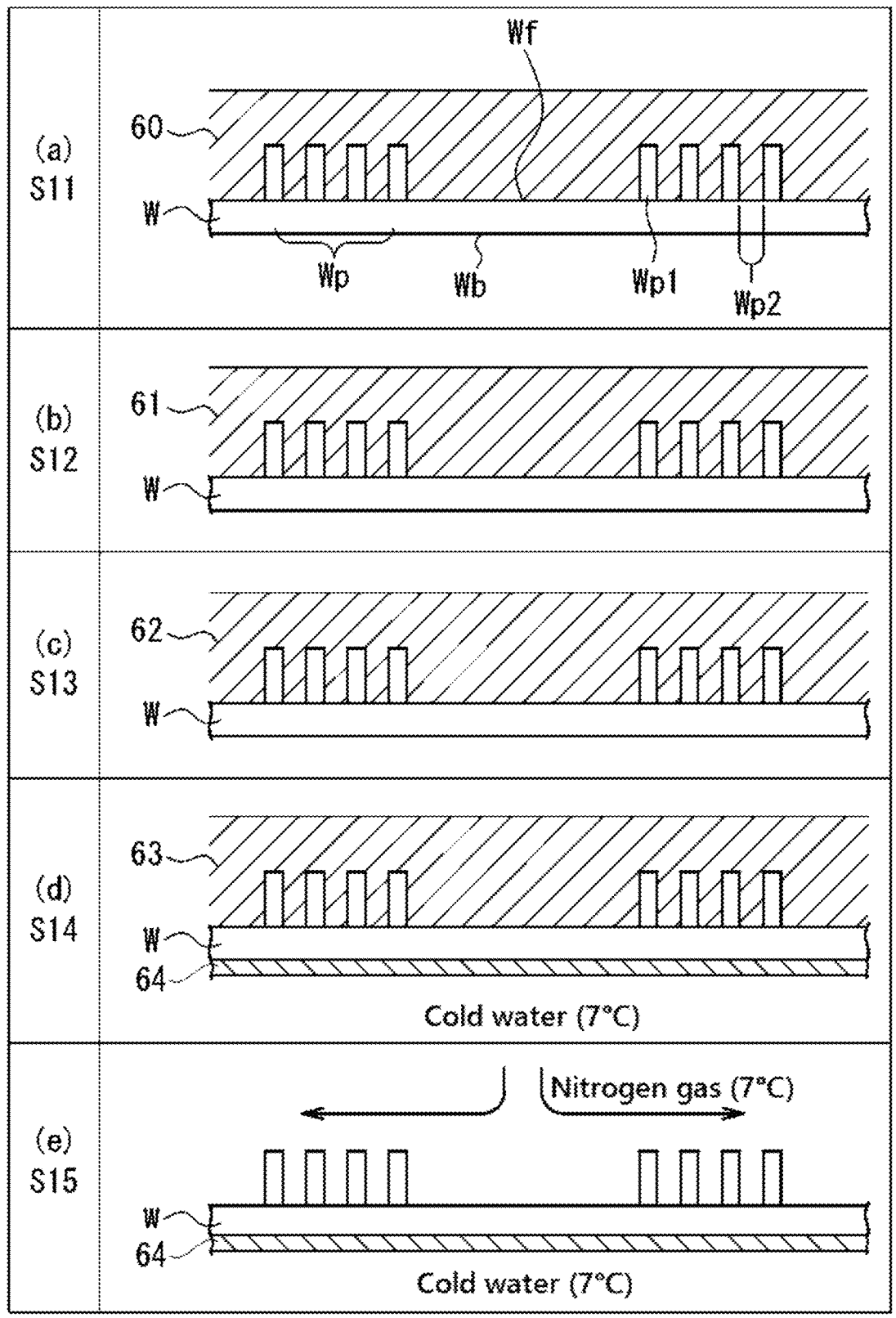
FIG. 8 is a diagram showing the state of the substrate in each step of the substrate treating method.

A substrate treating method using the substrate treating apparatus 1 of the present embodiment will be described below with reference to FIGS. 7 and 8. FIG. 7 is a flowchart showing the operation of the substrate treating apparatus 1 according to the first embodiment. FIG. 8 is a schematic view showing the state of the substrate W in each step of FIG. 7. On the substrate W, a concave/convex pattern Wp is formed in the preceding step. The pattern Wp includes convex portions Wp1 and concave portions Wp2. In the present embodiment, the height of the convex portion Wp1 falls within a range of 100 to 600 nm, and the width thereof falls within a range of 10 to 50 nm. The shortest distance between two adjacent convex portions Wp1 (the shortest width of the concave portions Wp2) falls within a range of 10 to 50 nm. The aspect ratio of the convex portion Wp1, that is, a value (height/width) obtained by dividing the height by the width falls within a range of 10 to 20.

The individual steps shown in FIGS. 8(a) to 8(e) are processed under an atmospheric pressure environment unless otherwise explicitly indicated. Here, the atmospheric pressure environment refers to an environment which is equal to or more than 0.7 atmospheres and equal to or less than 1.3 atmospheres with the standard atmospheric pressure (1 atmosphere, 1013 hPa) in the center. In particular, when the substrate treating apparatus 1 is arranged within a clean room having a positive pressure, the environment of the front surface Wf of the substrate W is higher than 1 atmosphere.

In FIG. 7, an operator first provides an instruction to perform a substrate processing program 19 corresponding to a predetermined substrate W. Thereafter, as a preparation for loading the substrate W into the substrate treating apparatus 1, the operation instruction is provided by the control unit 13 so as to perform the following operation.

The rotation of the rotarily driving part 52 is stopped, and the chuck pins 54 are located in positions suitable for receiving and delivering the substrate W. The valves 26, 36, 46 and 74 are closed, and the nozzles 22, 32 and 42 are respectively located in the retraction positions P1, P2 and P3. Then, the chuck pins 54 are brought into an opened state by an unillustrated opening/closing mechanism.

When the unprocessed substrate W is loaded into the substrate treating apparatus 1 by an unillustrated substrate loading/unloading mechanism and is placed on the chuck pins 54, the chuck pins 54 are brought into a closed state by the unillustrated opening/closing mechanism.

After the unprocessed substrate W is held by the substrate holder 51, a washing step S11 is performed on the substrate by an unillustrated wet washing unit. The washing step S11 includes rinse processing for supplying a washing liquid to the front surface Wf of the substrate W so as to perform washing and then removing the washing liquid. The washing liquid (the rinse liquid in the case of the rinse processing) is supplied to the front surface Wf of the substrate W rotated about the axis A1 at a constant speed by the operation instruction of the control unit 13 to the rotarily driving part 52. The washing liquid is not particularly limited, and for example, SC-1 (liquid containing ammonia, a hydrogen peroxide solution and water), SC-2 (liquid containing hydrochloric acid, a hydrogen peroxide solution and water) and the like can be mentioned. The rinse liquid is not particularly limited, and for example, DIW and the like can be mentioned. The amounts of washing liquid and rinse liquid supplied are not particularly limited, and can be set as necessary according to the range which is washed and the like. The washing time is not particularly limited, and can be set as necessary.

In the present embodiment, the wet washing unit is used, thus the SC-1 is supplied to the front surface Wf of the substrate W so as to wash the front surface Wf and thereafter the DIW is further supplied to the front surface Wf so as to remove the SC-1.

FIG. 8(a) shows a state of the substrate W when the washing step S11 is completed. As shown in the figure, on the front surface Wf of the substrate W on which the pattern Wp is formed, the DIW (represented by "60" in the figure) supplied in the washing step S11 is adhered.

With reference back to FIG. 7, an IPA rinsing step S12 of supplying the IPA to the front surface Wf of the substrate W on which the DIW 60 is adhered is performed. The control unit 13 first provides the operation instruction to the rotarily driving part 52 such that the substrate W is rotated about the axis A1 at a constant speed.

Then, the control unit 13 provides the operation instruction to the revolvingly driving part 14 such that the nozzle 32 is located in the center portion of the front surface Wf of the substrate W. Then, the control unit 13 provides the operation instruction to the valve 36 such that the valve 36 is opened. In this way, the IPA is supplied from the IPA tank 37 through the pipe 35 and the nozzle 32 to the front surface Wf of the substrate W.

The IPA supplied to the front surface Wf of the substrate W is made to flow from around the center of the front surface Wf of the substrate W toward the peripheral portion of the substrate W by centrifugal force generated by the rotation of the substrate W so as to be diffused over the entire front surface Wf of the substrate W. In this way, the DIW adhered to the front surface Wf of the substrate W is removed by the supply of the IPA, and thus the entire front surface Wf of the substrate W is covered with the IPA. The rotation speed of the substrate W is preferably set such that the thickness of the film formed of the IPA is higher than the height of the convex portions Wp1 on the entire front surface Wf. The amount of IPA supplied is not particularly limited, and can be set as necessary.

After the completion of the IPA rinsing step S12, the control unit 13 provides the operation instruction to the valve 36 such that the valve 36 is closed. The control unit 13 also provides the operation instruction to the revolvingly driving part 14 such that the nozzle 32 is located in the retraction position P2.

FIG. 8(b) shows a state of the substrate W when the IPA rinsing step S12 is completed. As shown in the figure, on the front surface Wf of the substrate W on which the pattern Wp is formed, the IPA (represented by "61" in the figure) supplied in the IPA rinsing step S12 is adhered, and the DIW 60 is replaced by the IPA 61 so as to be removed from the front surface Wf of the substrate W.

With reference back to FIG. 7, a process liquid supplying step (supplying step) S13 of supplying the process liquid which contains the dry auxiliary substance in the molten state and which serves as the dry assistant liquid is then performed. The control unit 13 first provides the operation instruction to the rotarily driving part 52 such that the substrate W is rotated about the axis A1 at a constant speed. Here, the rotation speed of the substrate W is preferably set such that the thickness of the liquid film formed of the dry assistant liquid is higher than the height of the convex portions Wp1 on the entire front surface Wf.

Then, the control unit 13 provides the operation instruction to the revolvingly driving part 14 such that the nozzle 22 is located in the center portion of the front surface Wf of the substrate W. The control unit 13 then provides the operation instruction to the valve 26 such that the valve 26 is opened. In this way, the dry assistant liquid is supplied from the process liquid storing tank 271 through the pipe 25 and the nozzle 22 to the front surface Wf of the substrate W.

The temperature of the supplied dry assistant liquid is set within a range equal to or above the melting point of the dry auxiliary substance and below the boiling point thereof at least after the dry assistant liquid is supplied to the front surface Wf of the substrate W. For example, when as the dry auxiliary substance, 1, 1, 2, 2, 3, 3, 4-heptafluorocyclopentane (having a boiling point of 82.5° C.) described above is used, the temperature is preferably set within a range equal to or more than 35° C. and equal to or less than 82° C. The amount of dry assistant liquid supplied is not particularly limited, and can be set as necessary.

As described above, the dry assistant liquid is supplied after being brought into a state where the dry assistant liquid has a high temperature equal to or above the melting point, and thus the solidified body can be formed after the formation of the liquid film of the dry assistant liquid on the front surface Wf of the substrate W. Consequently, the solidified body in the shape of a film having a uniform layer thickness is obtained, and thus it is possible to reduce the occurrence of unevenness in dryness. When the temperature of the substrate W and the temperature of the atmosphere within the chamber 11 are equal to or below the melting point of the dry auxiliary substance, the dry assistant liquid whose temperature is slightly higher than the melting point is supplied to the substrate W, and thus the dry assistant liquid may be solidified within an extremely short period of time after the dry assistant liquid makes contact with the substrate W. In this case, the solidified body having a uniform layer thickness cannot be formed, and thus it is difficult to reduce unevenness in dryness. Hence, when the temperature of the substrate W and the temperature of the atmosphere within the chamber 11 are equal to or below the melting point of the dry auxiliary substance, temperature adjustment is preferably performed such that the temperature of the dry assistant liquid is sufficiently higher than the melting point.

The dry assistant liquid supplied to the front surface Wf of the substrate W is made to flow from around the center of the front surface Wf of the substrate W toward the peripheral portion of the substrate W by the centrifugal force generated by the rotation of the substrate W so as to be diffused over the entire front surface Wf of the substrate W. In this way, the IPA adhered to the front surface Wf of the substrate W is removed by the supply of the dry assistant liquid, and thus the entire front surface Wf of the substrate W is covered with the dry assistant liquid. After the completion of the process liquid supplying step S13, the control unit 13 provides the operation instruction to the valve 26 such that the valve 26 is closed. The control unit 13 also provides the operation instruction to the revolvingly driving part 14 such that the nozzle 22 is located in the retraction position P1.

FIG. 8(c) shows a state of the substrate W when the process liquid supplying step S13 is completed. As shown in the figure, on the front surface Wf of the substrate W on which the pattern Wp is formed, the dry assistant liquid (represented by "62" in the figure) supplied in the process liquid supplying step S13 is adhered, and the IPA 61 is replaced by the dry assistant liquid 62 so as to be removed from the front surface Wf of the substrate W.

With reference back to FIG. 7, a solidifying step S14 of solidifying the dry assistant liquid 62 supplied to the front surface Wf of the substrate W so as to form a solidified film of the dry auxiliary substance is then performed. The control unit 13 first provides the operation instruction to the rotarily driving part 52 such that the substrate W is rotated about the axis A1 at a constant speed. Here, the rotation speed of the substrate W is set such that the dry assistant liquid 62 can form a predetermined film thickness higher than the convex portions Wp1 on the entire front surface Wf.

Then, the control unit 13 provides the operation instruction to the valve 84 such that the valve 84 is opened. In this way, the coolant (in the present embodiment, cold water having a temperature of 7° C.) is supplied from the coolant storage part 82 through the pipe 83 and the coolant supply pipe 85 toward the back surface Wb of the substrate W.

The cold water supplied to the back surface Wb of the substrate W is made to flow from around the center of the back surface Wb of the substrate W toward the direction of the peripheral portion of the substrate W by the centrifugal force generated by the rotation of the substrate W so as to be diffused over the entire back surface Wb of the substrate W. In this way, the liquid film of the dry assistant liquid 62 formed on the front surface Wf of the substrate W is cooled to a low temperature equal to or below the freezing point of the dry auxiliary substance so as to be solidified, with the result that the solidified body is formed.

FIG. 8(d) shows a state of the substrate W when the solidifying step S14 is completed. As shown in the figure, the dry assistant liquid 62 supplied in the process liquid supplying step S13 is cooled by the supply of the cold water (represented by "64" in the figure) having a temperature of 7° C. to the back surface Wb of the substrate W so as to be solidified, with the result that the solidified body (represented by "63" in the figure) containing the dry auxiliary substance is formed.

With reference back to FIG. 7, a sublimating step S15 of subliming the solidified body 63 formed on the front surface Wf of the substrate W so as to remove it from the front surface Wf of the substrate W is then performed. The sublimating step S15 is performed while the supply of the cold water to the back surface Wb of the substrate W by the coolant supplying unit 81 is being continued. In this way, the solidified body 63 can be cooled at a temperature equal to or below the freezing point of the dry auxiliary substance, and thus it is possible to prevent, from the side of the back surface Wb of the substrate W, the dry auxiliary substance from being melted.

In the sublimating step S15, the control unit 13 first provides the operation instruction to the rotarily driving part 52 such that the substrate W is rotated about the axis A1 at a constant speed. Here, the rotation speed of the substrate W is set such that the dry assistant liquid 62 can form a predetermined film thickness higher than the convex portions Wp1 on the entire front surface Wf.

Then, the control unit 13 provides the operation instruction to the revolvingly driving part 14 such that the nozzle 42 is located in the center portion of the front surface Wf of the substrate W. Then, the control unit 13 provides the operation instruction to the valve 46 such that the valve 46 is opened. In this way, the gas (in the present embodiment, nitrogen gas having a temperature of 7° C.) is supplied from the gas tank 47 through the pipe 45 and the nozzle 42 toward the front surface Wf of the substrate W.

Here, the partial pressure of the vapor of the dry auxiliary substance in the nitrogen gas is set lower than the saturated vapor pressure of the dry auxiliary substance at a temperature when the nitrogen gas is supplied. Hence, the nitrogen gas described above is supplied to the front surface Wf of the substrate W so as to make contact with the solidified body 63, and thus the dry auxiliary substance is sublimed from the solidified body 63 into the nitrogen gas. Since the nitrogen gas has a temperature lower than the melting point of the dry auxiliary substance, it is possible to sublime the solidified body 63 while preventing the melting of the solidified body 63.

In this way, the dry auxiliary substance in a solid state is sublimed, and thus when the substances such as the IPA present on the front surface Wf of the substrate W are removed, it is possible to satisfactorily dry the front surface Wf of the substrate W while the surface tension is prevented from acting on the pattern Wp so as to reduce the occurrence of a pattern collapse.

FIG. 8(e) shows a state of the substrate W when the sublimating step S15 is completed. As shown in the figure, the solidified body 63 of the dry auxiliary substance formed in the solidifying step S14 is sublimed by the supply of the nitrogen gas having a temperature of 7° C. so as to be removed from the front surface Wf, with the result that the drying of the front surface Wf of the substrate W is completed.

After the completion of the sublimating step S15, the control unit 13 provides the operation instruction to the valve 46 such that the valve 46 is closed. The control unit 13 also provides the operation instruction to the revolvingly driving part 14 such that the nozzle 42 is located in the retraction position P3.

In this way, a series of substrate dry processing steps are completed. After the substrate dry processing as described above, the substrate W on which the dry processing has been performed is unloaded from the chamber 11 by the unillustrated substrate loading/unloading mechanism.

As described above, in the present embodiment, the dry assistant liquid containing the dry auxiliary substance in the molten state is supplied to the front surface Wf of the substrate W to which the IPA is adhered, the dry assistant liquid is solidified on the front surface Wf of the substrate W so as to form the solidified body containing the dry auxiliary substance and thereafter the solidified body is sublimed so as to be removed from the front surface Wf of the substrate W, with the result that the dry processing is performed on the substrate W.

Here, as the dry auxiliary substance, a dry auxiliary substance is used whose vapor pressure at a temperature of 20 to 25° C. is equal to or more than 5 kPa and whose surface tension at a temperature of 20 to 25° C. is equal to or less than 25 mN/m, and thus it is possible to reduce, when the dry auxiliary substance is sublimed in the solidified body, the uneven progress of the sublimation. Consequently, a stress is prevented from being applied to the pattern, and thus it is possible to more reliably reduce the collapse of the pattern on the substrate than in the conventional substrate drying.

Second Embodiment

A second embodiment according to the present invention will be described below. The present embodiment differs from the first embodiment in that in the solidifying step S14, instead of the supplying of cold water by the coolant supplying unit 81, the supplying of nitrogen gas by the gas supplying unit 41 is performed. Even in the configuration described above, it is possible to satisfactorily dry the surface of the substrate while reducing the collapse of the pattern.

<2-1 Overall Configuration of Substrate Treating Apparatus and Dry Assistant Liquid>

A substrate treating apparatus and a control unit according to the second embodiment basically have the same configurations as the substrate treating apparatus 1 and the control unit 13 according to the first embodiment (see FIGS. 1 and 2), and thus they are identified with the same symbols, and the description thereof will be omitted. The dry assistant liquid used in the present embodiment is also the same as that according to the first embodiment, and thus the description thereof will be omitted.

<2-2 Substrate Treating Method>

Next, a substrate treating method according to the second embodiment using the substrate treating apparatus 1 having the same configuration as in the first embodiment will be described.

Figure 9:
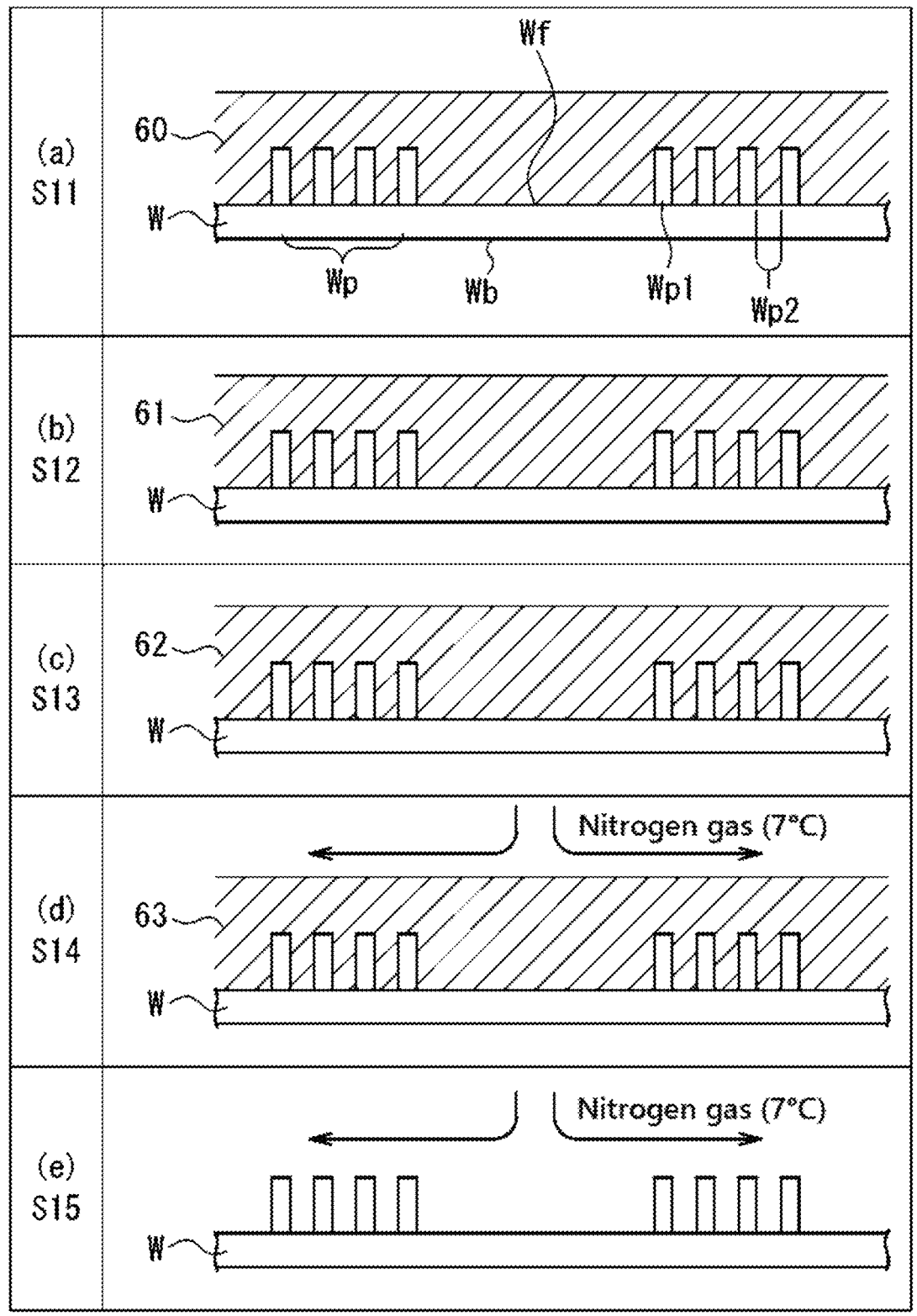
FIG. 9 is a flowchart showing a substrate treating method according to a second embodiment of the present invention.

The steps of substrate processing will be described below with reference to FIGS. 1, 2, 7 and 9 as necessary. FIG. 9 is a schematic view showing the state of the substrate W in each step of FIG. 7. In the second embodiment, the washing step S11, the IPA rinsing step S12 and the dry assistant liquid supplying step S13 shown in FIG. 6 and FIGS. 9(a) to 9(c) are the same as in the first embodiment, and thus the description thereof will be omitted.

Here, FIG. 9(a) shows a state of the substrate W in which the front surface Wf is covered by the liquid film of the DIW 60 when the washing step S11 in the second embodiment is completed, FIG. 9(b) shows a state of the substrate W in which the front surface Wf is covered by the liquid film of the IPA 61 when the IPA rinsing step S12 in the second embodiment is completed and FIG. 9(c) shows a state of the substrate W in which the front surface Wf is covered by the liquid film of the dry assistant liquid 62 melting the dry auxiliary substance when the dry assistant liquid supplying step S13 in the second embodiment is completed.

The individual steps shown in FIGS. 9(a) to 9(e) are processed under the atmospheric pressure environment unless otherwise indicated. Here, the atmospheric pressure environment refers to an environment which is equal to or more than 0.7 atmospheres and equal to or less than 1.3 atmospheres with the standard atmospheric pressure (1 atmosphere, 1013 hPa) in the center. In particular, when the substrate treating apparatus 1 is arranged within a clean room having a positive pressure, the environment of the front surface Wf of the substrate W is higher than 1 atmosphere. Each processing (details of which will be described later) shown in FIGS. 9(d) and 9(e) is performed under a reduced pressure environment of 1.7 Pa ($17 \times 10^{-5}$ atmospheres).

With reference to FIG. 7, after the washing step S11, the IPA rinsing step S12 and the dry assistant liquid supplying step S13 are performed, the solidifying step S14 is performed in which the liquid film of the dry assistant liquid 62 supplied to the front surface Wf of the substrate W is solidified so as to form the solidified body containing the dry auxiliary substance. Specifically, the control unit 13 first provides the operation instruction to the rotarily driving part 52 such that the substrate W is rotated about the axis A1 at a constant speed. Here, the rotation speed of the substrate W is preferably set such that the thickness of the liquid film formed of the dry assistant liquid is higher than the height of the convex portions Wp1 on the entire front surface Wf.

Then, the control unit 13 provides the operation instruction to the revolvingly driving part 14 such that the nozzle 42 is located in the center portion of the front surface Wf of the substrate W. Then, the control unit 13 provides the operation instruction to the valve 46 such that the valve 46 is opened. In this way, the gas (in the present embodiment, nitrogen gas having a temperature of 7° C.) is supplied from the gas tank 47 through the pipe 45 and the nozzle 42 toward the front surface Wf of the substrate W.

The nitrogen gas supplied to the front surface Wf of the substrate W is made to flow from around the center of the front surface Wf of the substrate W toward the direction of the peripheral portion of the substrate W by the centrifugal force generated by the rotation of the substrate W so as to be diffused over the entire front surface Wf of the substrate W covered by the dry assistant liquid 62. In this way, the liquid film of the dry assistant liquid 62 formed on the front surface Wf of the substrate W is cooled to a low temperature equal to or below the freezing point of the dry auxiliary substance so as to be solidified, with the result that the solidified body is formed.

FIG. 9(d) shows a state of the substrate W when the solidifying step S14 is completed. As shown in the figure, the dry assistant liquid 62 supplied in the process liquid supplying step S13 is cooled by the supply of the nitrogen gas having a temperature of 7° C. so as to be solidified, with the result that the solidified body 63 containing the dry auxiliary substance is formed.

With reference back to FIG. 7, the sublimating step S15 of subliming the solidified body 63 formed on the front surface Wf of the substrate W so as to remove it from the front surface Wf of the substrate W is then performed. Even in the sublimating step S15, the supply of the gas (nitrogen gas) from the nozzle 42 is continued from the solidifying step S14.

Here, the partial pressure of the vapor of the dry auxiliary substance in the nitrogen gas is set lower than the saturated vapor pressure of the dry auxiliary substance at a temperature when the nitrogen gas is supplied. Hence, the nitrogen gas described above is supplied to the front surface Wf of the substrate W so as to make contact with the solidified body 63, and thus the dry auxiliary substance is sublimed from the solidified body 63 into the nitrogen gas. Since the nitrogen gas has a temperature lower than the melting point of the dry auxiliary substance, it is possible to sublime the solidified body 63 while preventing the melting of the solidified body 63.

In this way, the dry auxiliary substance in the solid state is sublimed, and thus when the substances such as the IPA present on the front surface Wf of the substrate W are removed, it is possible to satisfactorily dry the front surface Wf of the substrate W while the surface tension is prevented from acting on the pattern Wp so as to reduce the occurrence of a pattern collapse.

FIG. 9(e) shows a state of the substrate W when the sublimating step S15 is completed. As shown in the figure, the solidified body 63 of the dry auxiliary substance formed in the solidifying step S14 is sublimed by the supply of the nitrogen gas having a temperature of 7° C. so as to be removed from the front surface Wf, with the result that the drying of the front surface Wf of the substrate W is completed.

After the completion of the sublimating step S15, the control unit 13 provides the operation instruction to the valve 46 such that the valve 46 is closed. The control unit 13 also provides the operation instruction to the revolvingly driving part 14 such that the nozzle 42 is located in the retraction position P3.

In this way, a series of substrate dry processing steps are completed. After the substrate dry processing as described above, the substrate W on which the dry processing has been performed is unloaded from the chamber 11 by the unillustrated substrate loading/unloading mechanism.

In the present embodiment, in the solidifying step S14 and the sublimating step S15, the common gas supplying unit 41 is used, and thus the nitrogen gas which is a gas inert to the dry auxiliary substance is supplied at a temperature equal to or below the freezing point of the dry auxiliary substance. In this way, immediately after the solidifying step S14, the sublimating step S15 can be started, the processing time necessary for operating the individual portions of the substrate treating apparatus 1 and the amount of memory in the substrate processing program 19 of the control unit 13 to be operated can be reduced and the number of components used in the processing can be reduced, with the result that it is possible to reduce the cost of the device. In particular, in the present embodiment, the pressure reducing unit 71 is not used, and thus the pressure reducing unit 71 can be omitted.

Third Embodiment

A third embodiment according to the present invention will be described below. The present embodiment differs from the second embodiment in that in the solidifying step S14 and the sublimating step S15, instead of the supply of the nitrogen gas, the interior of the chamber is reduced in pressure. Even in the configuration described above, it is possible to satisfactorily dry the surface of the substrate W while reducing the collapse of the pattern.

<3-1 Overall Configuration of Substrate Treating Apparatus and Dry Assistant Liquid>

A substrate treating apparatus and a control unit according to the third embodiment basically have the same configurations as the substrate treating apparatus 1 and the control unit 13 according to the first embodiment (see FIGS. 1 and 2), and thus they are identified with the same symbols, and the description thereof will be omitted. The dry assistant liquid used in the present embodiment is also the same as that according to the first embodiment, and thus the description thereof will be omitted.

<3-2 Substrate Treating Method>

Next, a substrate treating method according to the third embodiment using the substrate treating apparatus 1 having the same configuration as in the first embodiment will be described.

Figure 10:
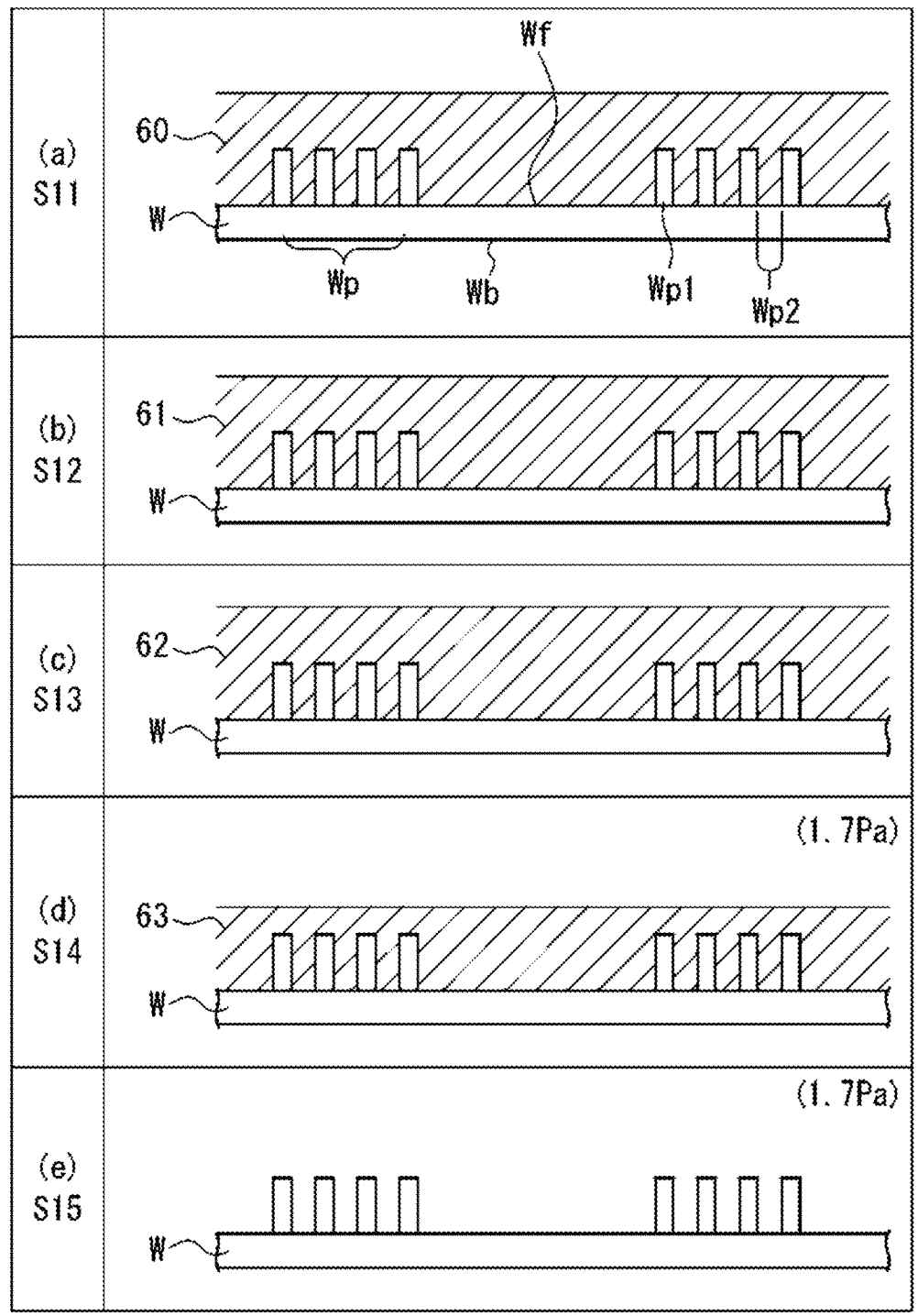
FIG. 10 is a flowchart showing a substrate treating method according to a third embodiment of the present invention.

The steps of substrate processing will be described below with reference to FIGS. 1, 2, 7 and 10 as necessary. FIG. 10 is a schematic view showing the state of the substrate W in each step of FIG. 7. In the third embodiment, the washing step S11, the IPA rinsing step S12 and the process liquid supplying step S13 shown in FIG. 7 and FIGS. 10(a) to 9(c) are the same as in the first embodiment, and thus the description thereof will be omitted.

Here, FIG. 10(a) shows a state of the substrate W in which the front surface Wf is covered by the liquid film of the DIW 60 when the washing step S11 in the third embodiment is completed, FIG. 10(b) shows a state of the substrate W in which the front surface Wf is covered by the liquid film of the IPA 61 when the IPA rinsing step S12 in the third embodiment is completed and FIG. 10(c) shows a state of the substrate W in which the front surface Wf is covered by the liquid film of the dry assistant liquid 62 melting the dry auxiliary substance (sublimable substance) when the process liquid supplying step S13 in the third embodiment is completed.

The individual steps shown in FIGS. 10(a) to 10(e) are processed under an atmospheric pressure environment unless otherwise indicated. Here, the atmospheric pressure environment refers to an environment which is equal to or more than 0.7 atmospheres but equal to or less than 1.3 atmospheres with the standard atmospheric pressure (1 atmosphere, 1013 hPa) in the center. In particular, when the substrate treating apparatus 1 is arranged within a clean room having a positive pressure, the environment of the front surface Wf of the substrate W is higher than 1 atmosphere. The processing (details of which will be described later) shown in FIGS. 10(d) and 10(e) are performed under a reduced pressure environment of 1.7 Pa ($1.7 \times 10^{-5}$ atmospheres).

With reference back to FIG. 7, after the washing step S11, the IPA rinsing step S12 and the process liquid supplying step S13 are performed, the solidifying step S14 is performed in which the liquid film of the dry assistant liquid 62 supplied to the front surface Wf of the substrate W is solidified so as to form the solidified body containing the dry auxiliary substance. Specifically, the control unit 13 first provides the operation instruction to the rotarily driving part 52 such that the substrate W is rotated about the axis A1 at a constant speed. Here, the rotation speed of the substrate W is preferably set such that the thickness of the liquid film formed of the dry assistant liquid is higher than the height of the convex portions Wp1 on the entire front surface Wf.

Then, the control unit 13 provides the operation instruction to the exhaust pump 72 such that the drive of the exhaust pump 72 is started. The control unit 13 then provides the operation instruction to the valve 74 such that the valve 74 is opened. In this way, the gas within the chamber 11 is exhausted through the valve 74 to the outside of the chamber 11. The interior of the chamber 11 is brought into a sealed state except the pipe 73, and thus the internal environment of the chamber 11 is reduced in pressure from atmospheric pressure.

The pressure reduction is performed from atmospheric pressure (about 1 atmosphere, about 1013 hPa) to about $1.7 \times 10^{-5}$ atmospheres (1.7 Pa). There is no limitation to the gas pressure described above in the practice of the invention of the present application, and the gas pressure within the chamber 11 after the pressure reduction may be set as necessary according to the pressure resistance and the like of the chamber 11 and the like. The interior of the chamber 11 is reduced in pressure, and thus the dry assistant liquid 62 supplied to the front surface Wf of the substrate W is evaporated, with the result that the dry assistant liquid 62 is cooled by the heat of the evaporation so as to be solidified.

FIG. 10(*d*) shows a state of the substrate W when the solidifying step S14 is completed. As shown in the figure, the dry assistant liquid 62 supplied in the process liquid supplying step S13 is cooled by the evaporation of the dry assistant liquid 62 caused by the pressure reduction within the chamber 11 so as to be solidified, with the result that the solidified body 63 of the dry auxiliary substance is formed.

Here, the layer thickness of the solidified body 63 is reduced only by the amount of dry assistant liquid 62 that has evaporated. Hence, in the process liquid supplying step S13 in the present embodiment, with consideration given to the amount of dry assistant liquid 62 evaporated in the solidifying step S14, the rotation speed of the substrate W and the like are preferably adjusted such that the dry assistant liquid 62 becomes a liquid film having a predetermined thickness or more.

With reference back to FIG. 7, the sublimating step S15 of subliming the solidified body 63 formed on the front surface Wf of the substrate W so as to remove it from the front surface Wf of the substrate W is then performed. Even in the sublimating step S15, the pressure reduction processing within the chamber 11 by the pressure reducing unit 71 is continued from the solidifying step S14.

By the pressure reduction processing, the pressure of the environment within the chamber 11 is lower than the saturated vapor pressure of the dry auxiliary substance. Hence, the pressure reduction environment as described above is maintained, and thus the dry auxiliary substance is sublimed from the solidified body 63.

When the dry auxiliary substance is sublimed from the solidified body 63, the solidified body 63 is deprived of heat as sublimation heat, and thus the solidified body 63 is cooled. Hence, in the third embodiment, in the sublimating step S15, even when the temperature of the environment within the chamber 11 is slightly higher (normal temperature environment) than the melting point of the dry auxiliary substance, the solidified body 63 can be maintained at a temperature lower than the melting point of the dry auxiliary substance without being additionally cooled, with the result that it is possible to sublime the solidified body 63 while preventing the melting of the solidified body 63. Consequently, it is not necessary to additionally provide a cooling mechanism, and thus it is possible to reduce the costs of the device and the processing.

As described above, the dry auxiliary substance in the solid state is sublimed, and thus when the substances such as the IPA present on the front surface Wf of the substrate W are removed, it is possible to satisfactorily dry the front surface Wf of the substrate W while the surface tension is prevented from acting on the pattern Wp so as to reduce the occurrence of a pattern collapse.

FIG. 10(*e*) shows a state of the substrate W when the sublimating step S15 is completed. As shown in the figure, the solidified body 63 of the dry auxiliary substance formed in the solidifying step S14 is sublimed by the formation of the pressure reduction environment with the chamber 11 so as to be removed from the front surface Wf, with the result that the drying of the front surface Wf of the substrate W is completed.

After the completion of the sublimating step S15, the control unit 13 provides the operation instruction to the valve 74 such that the valve 74 is opened. The control unit 13 also provides the operation instruction to the exhaust pump 72 such that the operation of the exhaust pump 72 is stopped. Then, the control unit 13 provides the operation instruction to the valve 46 such that the valve 46 is opened, and thus the gas (nitrogen gas) is introduced into the chamber 11 from the gas tank 47 through the pipe 45 and the nozzle 42, with the result that the interior of the chamber 11 is returned from the pressure reduction environment to the atmospheric pressure environment. Here, the nozzle 42 may be located in the retraction position P3 or may be located in the center portion of the front surface Wf of the substrate W.

The method of returning the interior of the chamber 11 to the atmospheric pressure environment after the completion of the sublimating step S15 is not limited to the method described above, and various types of known methods may be adopted.

In this way, a series of substrate dry processing steps are completed. After the substrate dry processing as described above, the substrate W on which the dry processing has been performed is unloaded from the chamber 11 by the unillustrated substrate loading/unloading mechanism.

As described above, in the present embodiment, the dry assistant liquid melting the dry auxiliary substance is supplied to the front surface Wf of the substrate W to which the IPA is adhered so as to replace the IPA. Thereafter, the dry assistant liquid is solidified on the front surface Wf of the substrate W so as to form the solidified film of the dry auxiliary substance, and then the dry auxiliary substance is sublimed so as to be removed from the front surface Wf of the substrate W. In this way, the dry processing is performed on the substrate W.

As in the present embodiment, even when the dry assistant liquid is solidified and sublimed by pressure reduction, it is possible to satisfactorily dry the substrate W while preventing the collapse of the pattern. Specific pattern reduction effects will be described later in examples.

In the present embodiment, in the solidifying step S14 and the sublimating step S15, the common pressure reducing unit 71 is used, and thus the interior of the chamber 11 is reduced in pressure. In this way, immediately after the solidifying step S14, the sublimating step S15 can be started, and the processing time necessary for operating the individual portions of the substrate treating apparatus 1 and the amount of memory in the substrate processing program 19 of the control unit 13 to be operated can be reduced. Moreover, the number of components used in the processing can be reduced, and thus it is possible to reduce the cost of the device. In particular, in the third embodiment, low-temperature nitrogen gas is not used, and thus the temperature adjusting part 272 in the gas supplying unit 41 can be omitted. When the interior of the chamber 11 is returned from the pressure reduction environment to the atmospheric pressure environment, and a means other than the gas supplying unit 41 is used, the gas supplying unit 41 may be omitted.

(Variations)

In the above discussion, the preferred embodiments of the present invention are described. However, the present invention is not limited to these embodiments, and can be practiced in other various forms. The major ones of the other various forms will be illustrated below.

In the first and second embodiments, within the one chamber 11, the individual steps are performed on the substrate W. However, there is no limitation to this configuration in the practice of the present invention, and a chamber may be prepared for each of the steps.

For example, in each of the embodiments, the following configuration may be adopted in which the steps up to the solidifying step S14 are performed in a first chamber, in which after the solidified film is formed on the front surface Wf of the substrate W, the substrate W is unloaded from the first chamber, in which the substrate W where the solidified film is formed is loaded into a separate second chamber and in which the sublimating step S15 is performed in the second chamber.

In the first embodiment, in the sublimating step S15, the nitrogen gas is supplied by the gas supplying unit 41 while the supply of the cold water by the coolant supplying unit 81 is being continued. However, there is no limitation to this configuration in the practice of the present invention, and the supply of the nitrogen gas by the gas supplying unit 41 may be stopped such that the dry auxiliary substance in the solidified body 63 is naturally sublimed while the cold water is being supplied by the coolant supplying unit 81.

Preferred examples of this invention will be illustratively described in detail below. However, unless otherwise restrictively described, materials, mixed amounts and the like described in the examples are not intended to limit the scope of this invention.

(Substrate)

Figure 11:
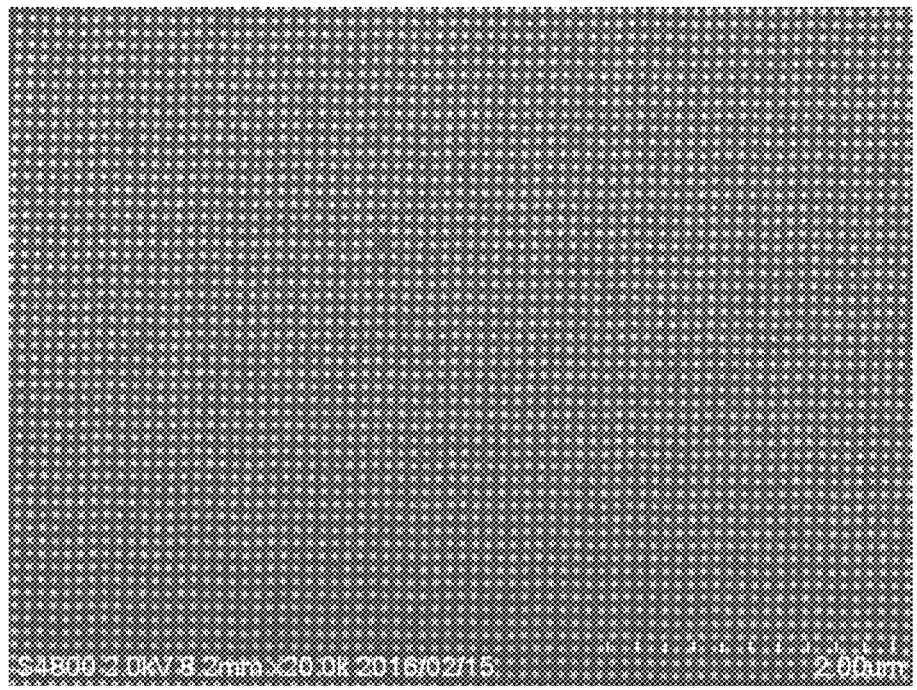
FIG. 11 is an SEM image showing a pattern-formed surface of an unprocessed silicon substrate used in examples and comparative examples of the present invention.

As a substrate, a silicon substrate in which a model pattern was formed on its front surface was prepared. FIG. 11 shows an SEM (Scanning Electron Microscope) image showing the surface of the silicon substrate on which the model pattern is formed. As the model pattern, a pattern was adopted in which cylinders (whose aspect ratio is 16) having a diameter of 30 nm and a height of 480 nm were aligned at intervals of about 80 nm. In FIG. 11, portions shown in white are the head portions of the cylinder portions (that is, the convex portions of the pattern), and the portions shown in black are the concave portions of the pattern. As shown in FIG. 11, it was confirmed that on the pattern-formed surface, white circles which were substantially equal in size to each other were aligned regularly.

Example 1

In the present example, by procedures described below, dry processing was performed on the silicon substrate, and the effect of reducing the collapse of the pattern was evaluated. In the processing of the silicon substrate, the substrate treating apparatus described in the first embodiment was used.

<Procedure 1-1 Radiation of Ultraviolet Rays>

Initially, ultraviolet rays were radiated onto the front surface of the silicon substrate to make the front surface property thereof hydrophilic. In this way, liquid easily entered the concave portions of the pattern, and thus after the supply of the liquid, an environment in which a pattern collapse easily occurred was artificially formed.

<Procedure 1-2 Supplying Step>

Then, within the chamber 11 under atmospheric pressure, a dry assistant liquid (whose temperature was 40° C.) formed by melting a sublimable substance was directly supplied to the dried pattern-formed surface of the silicon substrate. In this way, on the pattern-formed surface of the silicon substrate, a liquid film made of the dry assistant liquid was formed. As the sublimable substance, 1, 1, 2, 2, 3, 3, 4-heptafluorocyclopentane represented by a chemical structural formula below was used. In the compound described above, its surface tension was 19.6 mN/m under an environment of 25° C., and its vapor pressure was 8.2 kPa (62.0 mmHg) under an environment of 20° C. (they are literature values, and see Table 1 below). The compound was a substance whose melting point and freezing point were 20.5° C. and whose specific gravity was 1.58 under an environment of 25° C. Furthermore, the compound is excellent in the solubility of, for example, fluoropolymers so as to be used as a solvent for various types of coating agents and as a detergent for the stain of an oil film.

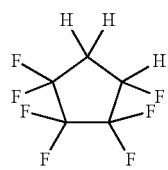

<Procedure 1-3 Solidifying Step>

Then, under an atmospheric pressure environment, nitrogen gas having a temperature of 7° C. was supplied onto the liquid film formed of the dry assistant liquid, and thus the dry assistant liquid was solidified so as to form a solidified body.

<Procedure 1-4 Sublimating Step>

Furthermore, under a normal temperature atmospheric pressure environment, the nitrogen gas having a temperature of 7° C. was continuously supplied to the solidified body, and thus the dry auxiliary substance (sublimable substance) was sublimed while the melting of the solidified body was prevented, with the result that the solidified body was removed from the pattern-formed surface of the silicon substrate. Since the temperature of the nitrogen gas was 7° C. and was lower than the melting point (20.5° C.) of 1, 1, 2, 2, 3, 3, 4-heptafluorocyclopentane, the cooling of the solidified body was not additionally performed.

Figure 12:
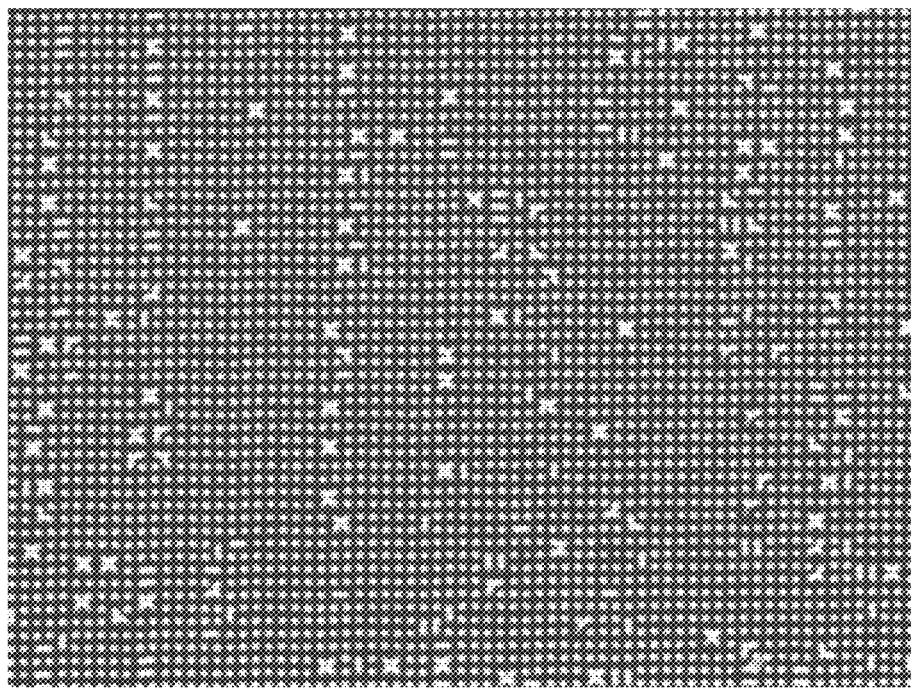
FIG. 12 is an SEM image showing a pattern-formed surface of a silicon substrate on which substrate processing in example 1 of the present invention is performed.

FIG. 12 is an SEM image of the silicon substrate after the procedures from 1-1 to 1-4 described above were performed. As compared with the pattern-formed surface (see FIG. 11) of the silicon substrate before the dry processing, the collapse of the pattern was reduced, and the collapse rate in the displayed region was 15.7%. In this way, it is shown that when as the dry auxiliary substance, 1, 1, 2, 2, 3, 3, 4-heptafluorocyclopentane is used, it is possible to extremely satisfactorily reduce the collapse of the pattern, and thus it is effective for sublimation drying.

The collapse rate described above was a value which was calculated by the formula below.

collapse rate(%)=(the number of convex portions collapsed in an arbitrary region)/(the total number of convex portions in the region)×100

Example 2

In the present example, as the dry auxiliary substance, instead of 1, 1, 2, 2, 3, 3, 4-heptafluorocyclopentane, dodecafluorocyclohexane (having a vapor pressure of 33.1 kPa (25° C.), a surface tension of 12.6 mN/m (25° C.) and a melting point and a freezing point of 51° C., all of which were literature values) was used (see Table 1 below). Except for that, as in example 1, the procedures from 1-1 to 1-4 were performed, and thus freeze drying was performed on the pattern-formed surface of the silicon substrate.

Figure 13:
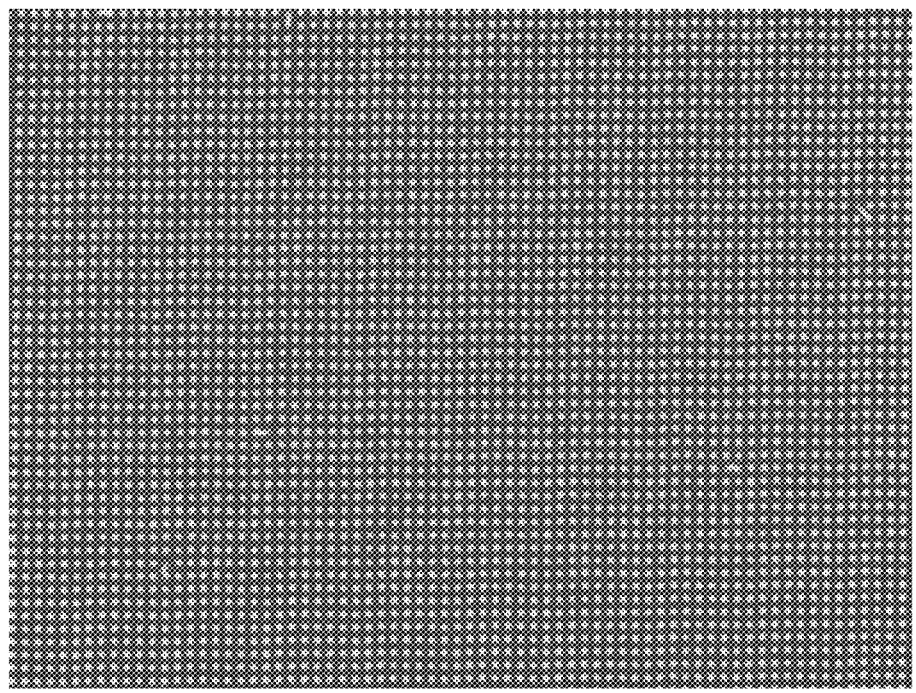
FIG. 13 is an SEM image showing a pattern-formed surface of a silicon substrate on which substrate processing in example 2 of the present invention is performed.

FIG. 13 is an SEM image of the silicon substrate after the procedures from 1-1 to 1-4 were performed in the present example. As compared with the pattern-formed surface (see FIG. 11) of the silicon substrate before the dry processing, the collapse of the pattern was significantly reduced, and the collapse rate in the displayed region was 2.5%. In this way, it is shown that when as the dry auxiliary substance, dodecafluorocyclohexane is used, it is possible to extremely satisfactorily reduce the collapse of the pattern, and thus it is effective for sublimation drying.

Comparative Example 1

In the present comparative example, as the dry auxiliary substance, instead of 1, 1, 2, 2, 3, 3, 4-heptafluorocyclopentane, t-butanol (having a vapor pressure of 4.1 kPa (20° C.), a surface tension of 19.56 mN/m (20° C.) and a melting point and a freezing point of 25° C., all of which were literature values) was used (see Table 1 below). Except for that, as in example 1, the procedures from 1-1 to 1-4 were performed, and thus freeze drying was performed on the pattern-formed surface of the silicon substrate.

Figure 14:
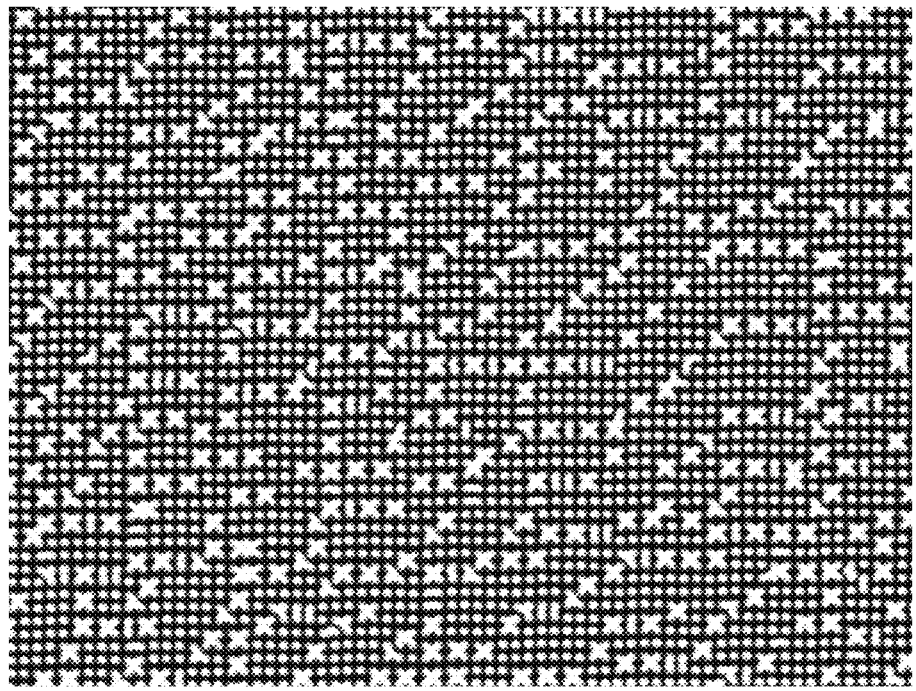
FIG. 14 is an SEM image showing a pattern-formed surface of a silicon substrate on which substrate processing in comparative example 1 is performed.

FIG. 14 is an SEM image of the silicon substrate after the procedures from 1-1 to 1-4 were performed in the present example. As compared with the pattern-formed surface (see FIG. 11) of the silicon substrate before the dry processing, the collapse of the pattern was not reduced, and the collapse rate in the displayed region was 52.3%. In this way, it is confirmed that when as the dry auxiliary substance, t-butanol is used, the reduction in the pattern collapse is insufficient.

Comparative Example 2

In the present comparative example, as the dry auxiliary substance, instead of 1, 1, 2, 2, 3, 3, 4-heptafluorocyclopentane, acetic acid (having a vapor pressure of 1.50 kPa (20° C.), a surface tension of 27.7 mN/m (20° C.) and a melting point and a freezing point of 17° C., all of which were literature values) was used (see Table 1 below). Except for that, as in example 1, the procedures from 1-1 to 1-4 were performed, and thus freeze drying was performed on the pattern-formed surface of the silicon substrate.

Figure 15:
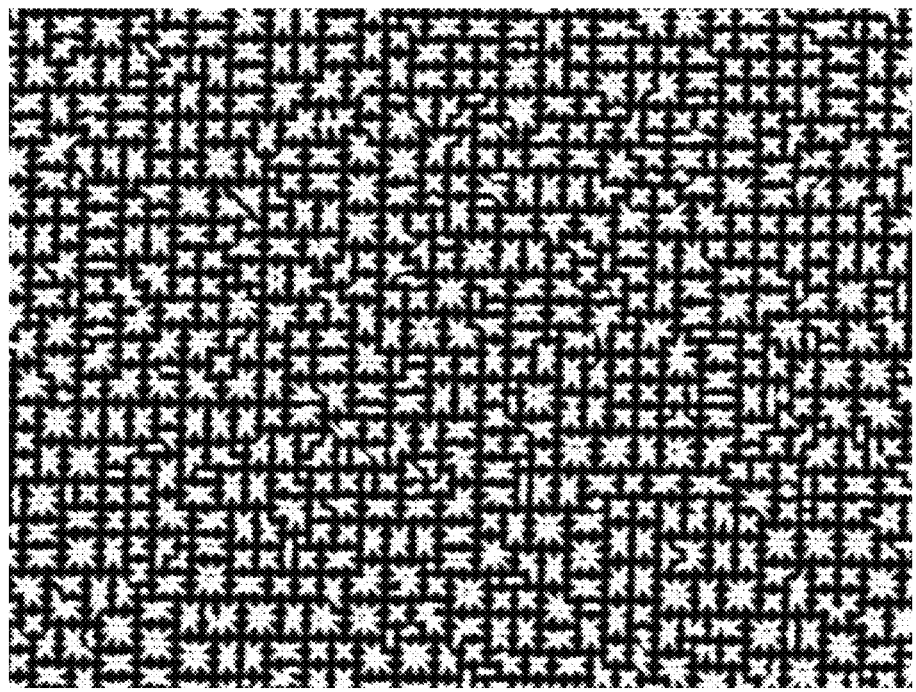
FIG. 15 is an SEM image showing a pattern-formed surface of a silicon substrate on which substrate processing in comparative example 2 is performed.

FIG. 15 is an SEM image of the silicon substrate after the procedures from 1-1 to 1-4 were performed in the present example. As compared with the pattern-formed surface (see FIG. 11) of the silicon substrate before the dry processing, the pattern was collapsed significantly, and the collapse rate in the displayed region was 99.1%. In this way, it is confirmed that when as the dry auxiliary substance, t-butanol is used, the reduction in the pattern collapse is insufficient.

Comparative Example 3

In the present comparative example, as the dry auxiliary substance, instead of 1, 1, 2, 2, 3, 3, 4-heptafluorocyclopentane, 1, 4-dioxane (having a vapor pressure of 3.9 kPa (20° C.), a surface tension of 33.4 mN/m (25° C.) and a melting point and a freezing point of 11° C., all of which were literature values) was used (see Table 1 below). Except for that, as in example 1, the procedures from 1-1 to 1-4 were performed, and thus freeze drying was performed on the pattern-formed surface of the silicon substrate.

Figure 16:
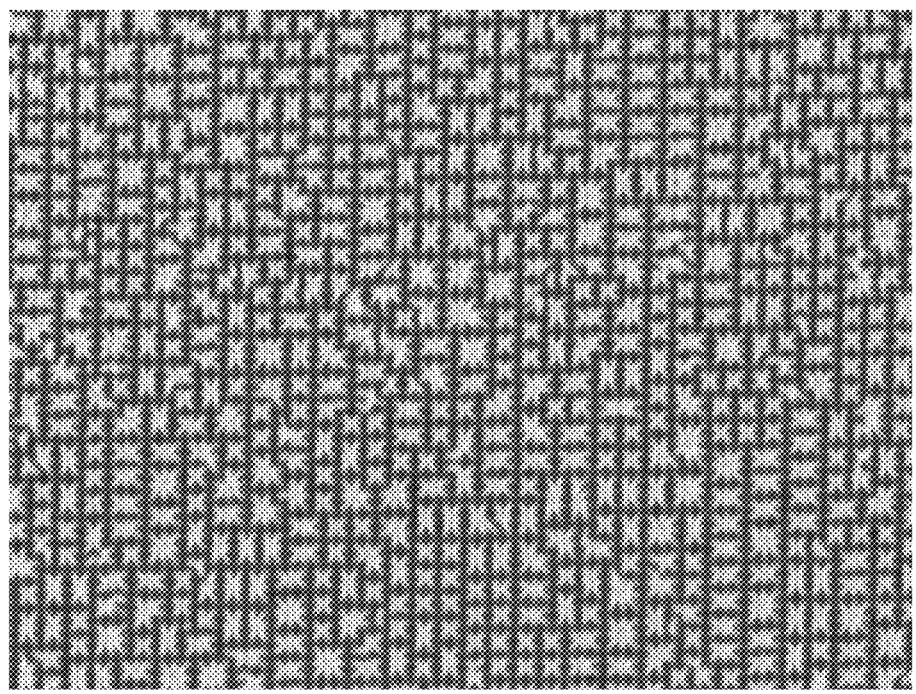
FIG. 16 is an SEM image showing a pattern-formed surface of a silicon substrate on which substrate processing in comparative example 3 is performed.

FIG. 16 is an SEM image of the silicon substrate after the procedures from 1-1 to 1-4 were performed in the present example. As compared with the pattern-formed surface (see FIG. 11) of the silicon substrate before the dry processing, the pattern was collapsed significantly, and the collapse rate in the displayed region was 99.3%. In this way, it is confirmed that when as the dry auxiliary substance, t-butanol is used, the reduction in the pattern collapse is insufficient.

Comparative Example 4

In the present comparative example, as the dry auxiliary substance, instead of 1, 1, 2, 2, 3, 3, 4-heptafluorocyclopentane, 4, 4-difluorocyclohexane (having a vapor pressure of 0.37 kPa (25° C.), a surface tension of 29.2 mN/m (25° C.) and a melting point and a freezing point of 35 to 36° C., all of which were literature values) was used (see Table 1 below). Except for that, as in example 1, the procedures from 1-1 to 1-4 were performed, and thus freeze drying was performed on the pattern-formed surface of the silicon substrate.

Figure 17:
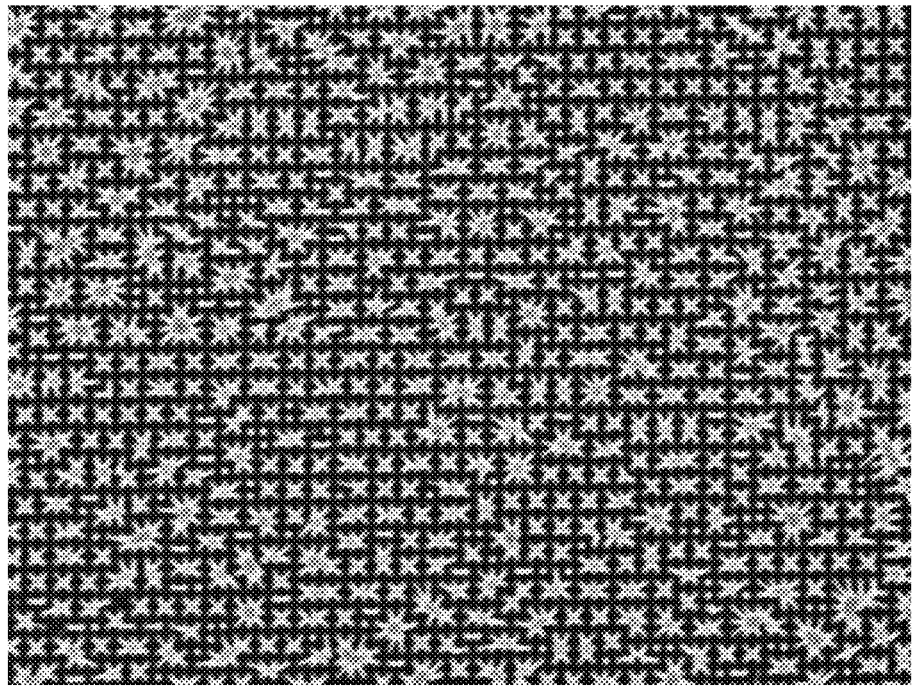
FIG. 17 is an SEM image showing a pattern-formed surface of a silicon substrate on which substrate processing in comparative example 4 is performed.

FIG. 17 is an SEM image of the silicon substrate after the procedures from 1-1 to 1-4 were performed in the present example. As compared with the pattern-formed surface (see FIG. 11) of the silicon substrate before the dry processing, the pattern was collapsed significantly, and the collapse rate in the displayed region was 97.0%. In this way, it is confirmed that when as the dry auxiliary substance, t-butanol is used, the reduction in the pattern collapse is insufficient.

Comparative Example 5

In the present comparative example, as the dry auxiliary substance, instead of 1, 1, 2, 2, 3, 3, 4-heptafluorocyclopentane, fluorocyclohexane (having a vapor pressure of 5.67 kPa (25° C.), a surface tension of 21.8 mN/m (25° C.) and a melting point and a freezing point of 13° C., all of which were literature values) was used (see Table 1 below). Except for that, as in example 1, the procedures from 1-1 to 1-4 were performed, and thus freeze drying was performed on the pattern-formed surface of the silicon substrate.

Figure 18:
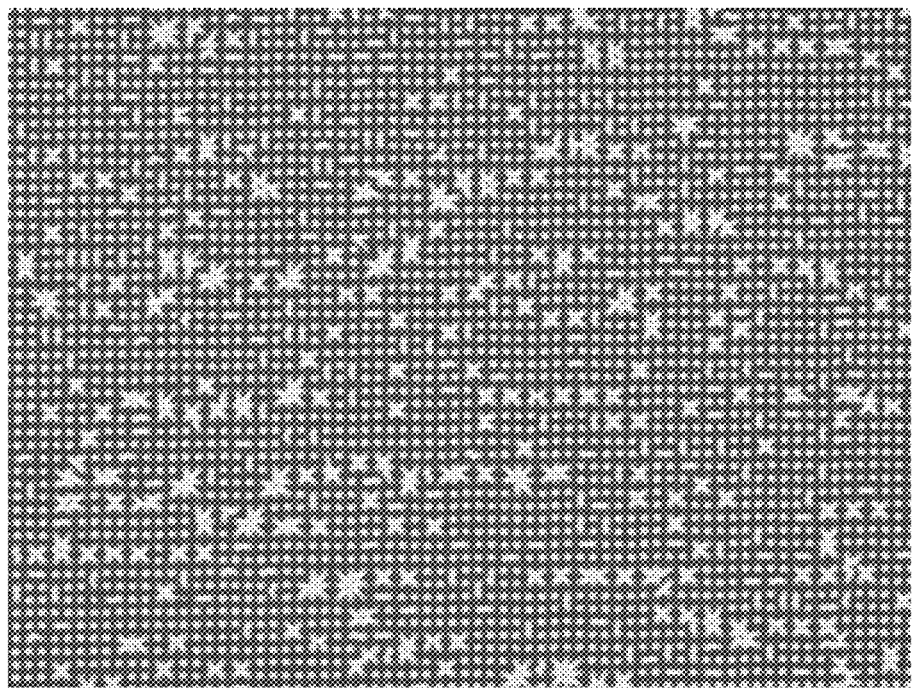
FIG. 18 is an SEM image showing a pattern-formed surface of a silicon substrate on which substrate processing in comparative example 5 is performed.

FIG. 18 is an SEM image of the silicon substrate after the procedures from 1-1 to 1-4 were performed in the present example. As compared with the pattern-formed surface (see FIG. 11) of the silicon substrate before the dry processing, the collapse of the pattern was not reduced, and the collapse rate in the displayed region was 35.8%. In this way, it is confirmed that when as the dry auxiliary substance, t-butanol is used, the reduction in the pattern collapse is insufficient.

TABLE 1

| | Sublimable substance | Melting point (° C.) | Vapor pressure (kPa) | Surface tension (mN/m) |
|---|---|---|---|---|
| Example 1 | 1,1,2,2,3,3,4-heptafluorocyclopentane | 20.5 | 8.2 (20° C.) | 19.6 (25° C.) |
| Example 2 | dodecafluorocyclohexane | 51 | 33.1 (25° C.) | 12.6 (25° C.) |
| Comparative example 1 | 2-methyl-2-propanol | 25 | 4.1 (20° C.) | 19.56 (20° C.) |

TABLE 1-continued

| | Sublimable substance | Melting point (° C.) | Vapor pressure (kPa) | Surface tension (mN/m) |
|---|---|---|---|---|
| Comparative example 2 | acetic acid | 17 | 1.5 (20° C.) | 27.7 (20° C.) |
| Comparative example 3 | 1,4-dioxane | 11 | 3.9 (20° C.) | 33.4 (25° C.) |
| Comparative example 4 | 4,4-difluorocyclohexane | 35-36 | 0.37 (25° C.) | 29.2 (25° C.) |
| Comparative example 5 | fluorocyclonexane | 13 | 5.67 (25° C.) | 21.8 (25° C.) |

(Result)

As shown in FIGS. 12 to 18, it is confirmed that in examples 1 and 2 in which as the dry auxiliary substances, 1, 1, 2, 2, 3, 3, 4-heptafluorocyclopentane and dodecafluorocyclohexane are used, for example, as compared with comparative examples 1 to 5 in which the conventional dry auxiliary substances are used, it is possible to reduce the occurrence of a pattern collapse.

The present invention can be applied to dry technology for removing liquid adhered to the front surface of a substrate and substrate processing technology in general for processing the front surface of a substrate using the dry technology.

What is claimed is:

1. A substrate treating apparatus which is used in dry processing on a pattern-formed surface of a substrate, the substrate treating apparatus comprising:
   a supplying unit which includes a process liquid storing tank that stores a process liquid containing a sublimable substance in a molten state and a process liquid temperature adjusting part which adjusts a temperature of the process liquid within the process liquid storing tank and which supplies the process liquid to the pattern-formed surface of the substrate;
   a solidifying unit which includes a gas storing part that stores a gas and a gas temperature adjusting part that adjusts a temperature of the gas stored in the gas storing part, which supplies the gas at a temperature equal to or less than a freezing point of the sublimable substance to the process liquid on the pattern-formed surface of the substrate and which solidifies the process liquid on the pattern-formed surface so as to form a solidified body; and
   a sublimating unit which includes a coolant tank that stores a coolant and a coolant temperature adjusting part that adjusts a temperature of the coolant stored in the coolant tank, which supplies the coolant at the temperature equal to or less than the freezing point of the sublimable substance toward a back surface on a side opposite to the pattern-formed surface of the substrate so as to prevent the solidified body from being melted, and which simultaneously sublimes the solidified body so as to remove the solidified body from the pattern-formed surface,
   wherein a vapor pressure of the sublimable substance at a temperature of 20 to 25° C. is equal to or more than 5 kPa, and a surface tension thereof at a temperature of 20 to 25° C. is equal to or less than 25 mN/m, and
   the process liquid temperature adjusting part adjusts the temperature of the process liquid such that the temperature of the process liquid within the process liquid storing tank is equal to or above a melting point of the sublimable substance and below a boiling point thereof.

2. The substrate treating apparatus according to claim 1, wherein the surface tension of the sublimable substance at the temperature of 20 to 25° C. is equal to or less than 20 mN/m.

3. The substrate treating apparatus according to claim 2, wherein the sublimable substance is 1, 1, 2, 2, 3, 3, 4-heptafluorocyclopentane or dodecafluorocyclohexane.

4. The substrate treating apparatus according to claim 2, wherein the supplying unit supplies, under atmospheric pressure, the process liquid to the pattern-formed surface of the substrate, and
the solidifying unit cools, under atmospheric pressure, the process liquid to a freezing point of the sublimable substance or below.

5. The substrate treating apparatus according to claim 2, wherein the sublimable substance has sublimability under atmospheric pressure, and
the sublimating unit sublimes the sublimable substance under atmospheric pressure.

6. The substrate treating apparatus according to claim 2, wherein the sublimating unit includes, instead of the coolant tank and the coolant temperature adjusting part, an exhaust pump which reduces a pressure of the pattern-formed surface on which the solidified body is formed to an environment lower than atmospheric pressure.

7. The substrate treating apparatus according to claim 1, wherein the process liquid is formed of only the sublimable substance in the molten state.

8. A substrate treating apparatus which is used in dry processing on a pattern-formed surface of a substrate, the substrate treating apparatus comprising:
   a supplying unit which includes a process liquid storing tank that stores a process liquid containing a sublimable substance in a molten state and a process liquid temperature adjusting part which adjusts a temperature of the process liquid within the process liquid storing tank and which supplies the process liquid under atmospheric pressure to the pattern-formed surface of the substrate;
   a solidifying unit which includes a coolant tank that stores a coolant and a coolant temperature adjusting part that adjusts a temperature of the coolant stored in the coolant tank, which supplies the coolant at a temperature equal to or less than a freezing point of the sublimable substance toward a back surface on a side opposite to the pattern-formed surface of the substrate and which solidifies the process liquid under atmospheric pressure on the pattern-formed surface so as to form a solidified body; and
   a sublimating unit which shares the coolant tank and the coolant temperature adjusting part in the solidifying unit, which supplies the coolant at the temperature equal to or less than the freezing point of the sublimable substance toward the back surface on the side opposite to the pattern-formed surface of the substrate so as to prevent the solidified body from being melted, and which simultaneously sublimes the solidified body so as to remove the solidified body from the pattern-formed surface, wherein a vapor pressure of the sublimable substance at a temperature of 20 to 25° C. is equal to or more than 5 kPa, and a surface tension thereof at a temperature of 20 to 25° C. is equal to or less than 25 mN/m, and the process liquid temperature adjusting part adjusts the temperature of the process liquid such that the temperature of the process liquid within the process liquid storing tank is equal to or above a melting point of the sublimable substance and below a boiling point thereof.

9. The substrate treating apparatus according to claim 8, wherein the sublimating unit further includes, in addition to the coolant tank and the coolant temperature adjusting part, the gas storing part and the gas temperature adjusting part such that the gas storing part and the gas temperature adjusting part are shared by the solidifying unit, supplies the gas at a temperature equal to or below the freezing point of the sublimable substance toward the pattern-formed surface, and sublimes the solidified body so as to remove the solidified body from the pattern-formed surface.

10. A substrate treating apparatus which is used in dry processing on a pattern-formed surface of a substrate, the substrate treating apparatus comprising:

a supplying unit which includes a process liquid storing tank that stores a process liquid containing a sublimable substance in a molten state and a process liquid temperature adjusting part which adjusts a temperature of the process liquid within the process liquid storing tank and which supplies the process liquid under atmospheric pressure to the pattern-formed surface of the substrate;

a solidifying unit which includes a gas storing part that stores a gas and a gas temperature adjusting part that adjusts a temperature of the gas stored in the gas storing part, which supplies the gas at a temperature equal to or less than a freezing point of the sublimable substance to the process liquid on the pattern-formed surface of the substrate and which solidifies the process liquid under atmospheric pressure on the pattern-formed surface so as to form a solidified body; and a sublimating unit which shares the gas storing part and the gas temperature adjusting part in the solidifying unit, which supplies the gas at the temperature equal to or less than the freezing point of the sublimable substance toward the pattern-formed surface so as to sublime and remove the solidified body from the pattern-formed surface, wherein a vapor pressure of the sublimable substance at a temperature of 20 to 25° C. is equal to or more than 5 kPa, and a surface tension thereof at a temperature of 20 to 25° C. is equal to or less than 25 mN/m, and the process liquid temperature adjusting part adjusts the temperature of the process liquid such that the temperature of the process liquid within the process liquid storing tank is equal to or above a melting point of the sublimable substance and below a boiling point thereof.

11. A substrate treating apparatus which is used in dry processing on a pattern-formed surface of a substrate, the substrate treating apparatus comprising:

a supplying unit which includes a process liquid storing tank that stores a process liquid containing a sublimable substance in a molten state and a process liquid temperature adjusting part which adjusts a temperature of the process liquid within the process liquid storing tank and which supplies the process liquid to the pattern-formed surface of the substrate;

a solidifying unit which includes an exhaust pump that reduces a pressure of the pattern-formed surface to which the process liquid is supplied to an environment lower than atmospheric pressure and that solidifies the process liquid on the pattern-formed surface so as to form a solidified body; and a sublimating unit which includes a coolant tank that stores a coolant and a coolant temperature adjusting part that adjusts a temperature of the coolant stored in the coolant tank, which supplies the coolant at the temperature equal to or less than the freezing point of the sublimable substance toward a back surface on a side opposite to the pattern-formed surface of the substrate so as to prevent the solidified body from being melted, and which simultaneously sublimes the solidified body so as to remove the solidified body from the pattern-formed surface, wherein a vapor pressure of the sublimable substance at a temperature of 20 to 25° C. is equal to or more than 5 kPa, and a surface tension thereof at a temperature of 20 to 25° C. is equal to or less than 25 mN/m, and the process liquid temperature adjusting part adjusts the temperature of the process liquid such that the temperature of the process liquid within the process liquid storing tank is equal to or above a melting point of the sublimable substance and below a boiling point thereof.

12. The substrate treating apparatus according to claim 11, comprising, instead of the coolant tank and the coolant temperature adjusting part, the exhaust pump as the sublimating unit.

* * * * *